(12) United States Patent
Slik

(10) Patent No.: US 9,817,715 B2
(45) Date of Patent: Nov. 14, 2017

(54) RESILIENCY FRAGMENT TIERING

(71) Applicant: NetApp, Inc., Sunnyvale, CA (US)

(72) Inventor: David Slik, Northridge, CA (US)

(73) Assignee: Netapp, Inc., Sunnyvale, CA (US)

( * ) Notice: Subject to any disclaimer, the term of this patent is extended or adjusted under 35 U.S.C. 154(b) by 115 days.

(21) Appl. No.: 14/696,302

(22) Filed: Apr. 24, 2015

(65) Prior Publication Data

US 2016/0314043 A1  Oct. 27, 2016

(51) Int. Cl.
| | | |
|---|---|---|
| G11C 29/00 | (2006.01) | |
| G06F 11/10 | (2006.01) | |
| G06F 3/06 | (2006.01) | |
| H03M 13/37 | (2006.01) | |
| H03M 13/15 | (2006.01) | |

(52) U.S. Cl.
CPC .......... *G06F 11/1076* (2013.01); *G06F 3/064* (2013.01); *G06F 3/0619* (2013.01); *G06F 3/0689* (2013.01); *H03M 13/373* (2013.01); *H03M 13/3761* (2013.01); *H03M 13/1515* (2013.01)

(58) Field of Classification Search
CPC .... G06F 11/1076; G06F 3/0689; G06F 3/064; G06F 3/0619; H03M 13/154
See application file for complete search history.

(56) References Cited

U.S. PATENT DOCUMENTS

| | | |
|---|---|---|
| 4,543,654 A | 9/1985 | Jones |
| 6,115,200 A | 9/2000 | Allen et al. |
| 6,505,216 B1 | 1/2003 | Schutzman et al. |
| 6,714,371 B1 | 3/2004 | Codilian |
| 6,735,033 B1 | 5/2004 | Codilian et al. |
| 7,177,248 B2 | 2/2007 | Kim et al. |
| 7,333,282 B2 | 2/2008 | Iseri et al. |
| 7,408,732 B2 | 8/2008 | Kisaka et al. |

(Continued)

FOREIGN PATENT DOCUMENTS

WO  2013152811 A1  10/2013

OTHER PUBLICATIONS

Rabin Efficient dispersal of information for security, load balancing, and fault tolerance (1989), pp. 335-348.*

(Continued)

*Primary Examiner* — Guy Lamarre
(74) *Attorney, Agent, or Firm* — Gilliam IP PLLC

(57) ABSTRACT

Technology is disclosed for a data storage architecture for providing enhanced storage resiliency for a data object. The data storage architecture can be implemented in a single-tier configuration and/or a multi-tier configuration. In the single-tier configuration, a data object is encoded, e.g., based on an erasure coding method, to generate many data fragments, which are stored across many storage devices. In the multi-tier configuration, a data object is encoded, e.g., based on an erasure coding method, to generate many data segments, which are sent to one or more tiers of storage nodes and at least one latent storage. Each of the storage nodes further encodes the data segment to generate many data fragments representing the data segment, which are stored across many storage devices associated with the storage node. The I/O operations for rebuilding the data in case of device failures is spread across many storage devices, which minimizes the wear of a given storage device.

19 Claims, 21 Drawing Sheets

(56) References Cited

U.S. PATENT DOCUMENTS

| | | |
|---|---|---|
| 8,099,605 B1 | 1/2012 | Billsroem et al. |
| 8,239,621 B2 | 8/2012 | Yamato |
| 8,819,259 B2 | 8/2014 | Zuckerman et al. |
| 8,838,911 B1 | 9/2014 | Hubin et al. |
| 8,949,449 B2 | 2/2015 | Zuckerman et al. |
| 8,959,281 B1 | 2/2015 | Malina et al. |
| 8,959,305 B1 | 2/2015 | Lecrone et al. |
| 8,990,162 B1 | 3/2015 | Kushwah et al. |
| 9,329,991 B2 | 5/2016 | Cohen et al. |
| 2004/0162940 A1 | 8/2004 | Yagisawa et al. |
| 2006/0271339 A1 | 11/2006 | Fukada |
| 2007/0104049 A1 | 5/2007 | Kim et al. |
| 2007/0156405 A1 | 7/2007 | Schulz et al. |
| 2007/0177739 A1 | 8/2007 | Ganguly et al. |
| 2007/0203927 A1 | 8/2007 | Cave et al. |
| 2008/0126357 A1 | 5/2008 | Casanova et al. |
| 2008/0151724 A1 | 6/2008 | Anderson et al. |
| 2008/0201336 A1 | 8/2008 | Yamato |
| 2008/0201401 A1 | 8/2008 | Pugh et al. |
| 2009/0100055 A1 | 4/2009 | Wang |
| 2009/0154559 A1 | 6/2009 | Gardner |
| 2009/0327840 A1 | 12/2009 | Moshayedi |
| 2010/0030960 A1 | 2/2010 | Kamalavannan et al. |
| 2010/0064166 A1 | 3/2010 | Dubnicki et al. |
| 2010/0094921 A1 | 4/2010 | Roy et al. |
| 2010/0094957 A1 | 4/2010 | Zuckerman et al. |
| 2010/0095060 A1 | 4/2010 | Strange et al. |
| 2010/0293354 A1 | 11/2010 | Perez et al. |
| 2011/0191629 A1 | 8/2011 | Daikokuya et al. |
| 2011/0296104 A1 | 12/2011 | Noda et al. |
| 2012/0060072 A1* | 3/2012 | Simitci ............... H03M 13/373 714/756 |
| 2013/0238235 A1 | 9/2013 | Kitchel et al. |
| 2014/0013046 A1 | 1/2014 | Corbett et al. |
| 2014/0108707 A1 | 4/2014 | Nowoczynski et al. |
| 2014/0207899 A1 | 7/2014 | Mark et al. |
| 2014/0237024 A1 | 8/2014 | Chen et al. |
| 2014/0297680 A1 | 10/2014 | Triou, Jr. et al. |
| 2014/0331085 A1 | 11/2014 | Dhuse et al. |
| 2014/0344532 A1 | 11/2014 | Lazier |
| 2015/0067245 A1 | 3/2015 | Kruger |
| 2015/0256577 A1 | 9/2015 | Gutiérrez et al. |
| 2015/0378825 A1 | 12/2015 | Resch |
| 2016/0179621 A1 | 6/2016 | Schirripa et al. |
| 2016/0314043 A1 | 10/2016 | Slik |

OTHER PUBLICATIONS

Amer, et al., "Data Management and Layout for Shingled Magnetic Recording", IEEE Transactions on Magnetics, Oct. 2011, vol. 47, No. 10., pp. 3691-3697, retrieved on Oct. 15, 2015 from http://www.ssrc.ucsc.edu/Papers/amer-ieeetm11.pdf.

Amer, et al., "Design Issue for a Shingled Write Disk System", 26th IEEE Symposium on Massive Storage Systems and Technologies (MSST 2010), May 2010, 12 pages, retrieved on Oct. 20, 2015 from http://storageconference.us/2010/Papers/MSST/Amer.pdf.

Dunn, et al., "Shingled Magnetic Recording Models, Standardization, and Applications", SNIA Education, Storage Networking Industry Association, Sep. 16, 2014, 44 pages, retrieved on Oct. 21, 2015 from http://www.snia.org/sites/default/files/Dunn-Feldman_SNIA_Tutorial_Shingled_Magnetic_Recording-r7_Final.pdf.

Feldman, et al., "Shingled Magnetic Recording Areal Density Increase Requires New Data Management", USENIX, The Advanced Computing Systems Association, Jun. 2013 vol. 38 No. 3, pp. 22-30, retrieved on Oct. 21, 2015 from https://www.cs.cmu.edu/~garth/papers/05_feldman_022-030_final.pdf.

Gibson, et al., "Direction for Shingled-Write and Two-Dimensional Magnetic Recording System Architectures: Synergies with Solid-State Disks", Carnegie Mellon University Parallel Data Lab Technical Report CMU-PDL-09-104, May 2009, 2 pages, retrieved on Oct. 20, 2015 from http://www.pdl.cmu.edu/PDL-FTP/PDSI/CMU-PDL-09-104.pdf.

Gibson, et al., "Principles of Operation for Shingled Disk Devices", Carnegie Mellon University Parallel Data Laboratory CMU-PDL-11-107, Apr. 2011, 9 pages, retrieved on Oct. 20, 2015 from http://www.pdl.cmu.edu/PDL-FTP/Storage/CMU-PDL-11-107.pdf.

Li, X., "Reliability Analysis of Deduplicated and Erasure-Coded Storage," ACM SIGMETRICS Performance Evaluation Review, vol. 38, No. 3, ACM New York, NY, Jan. 3, 2011, pp. 4-9.

Luo, "Implement Object Storage with SMR based Key-Value Store", 2015 Storage Developer Conference, Huawei Technologies Co., Sep. 2015, 29 pages, retrieved on Oct. 20, 2015 from http://www.snia.org/sites/default/files/SDC15_presentations/smr/QingchaoLuo_Implement_Object_Storage_SMR_Key-Value_Store.pdf.

Megans, "Spectra Logic Announces Breakthrough in Nearline Disk, ArcticBlue", SPECTA Logic, Boulder, CO, Oct. 15, 2015, 5 pages, retrieved on Oct. 20, 2015 from https://www.spectralogic.com/2015/10/15/spectra-logic-announces-breakthrough-in-nearline-disk-arcticblue/.

O'Reily, J., "Raid vs. Erasure Coding", Network Computing, Jul. 14, 2014, 2 pages, retrieved on Apr. 1, 2016 rom http://www.networkcomputing.com/storage/raid-vs-erasure-coding/1792588127.

Renzoni, R., "Wide Area Storage From Quantum," Quantum Corporation, 2012, 24 pages.

Seshadri, S., "High Availability and Data Protection with EMC Isilon Scale-Out NAS," EMC Corporation, White Japer, Jun. 2015, 37 pages, retrieved on Oct. 5, 2015 from https://www.emc.com/collateral/hardware/white-papers/h10588-isilon-data-availability-protection-wp.pdf.

SMR Layout Optimisation for XFS, Mar. 2015, v0.2, 7 pages, retrieved on Apr. 29, 2016 from http://xfs.org/images/f/f6/Xfs-smr-structure-0.2.pdf.

Speciale, P., "Scality RING: Scale Out File System & Hadoop over CDMI," Scality, Storage Developer Conference, Sep. 19-22, 2014, 26 pages. retrieved on Oct. 5, 2015 from http://www.snia.org/sites/default/files/PaulSpeciale_Hadoop_Ring.pdf.

Suresh, et al., "Shingled Magnetic Recording for Big Data Applications", Parallel Data Laboratory, Carnegie Mellon Jniversity, Pittsburg, PA CMU-PDL-12-105, May 2012, 29 pages, retrieved on Oct. 20, 2015 from http://www.pdl.cmu.edu/PDL-FTP/FS/CMU-PDL-12-105.pdf.

International Search Report and Written Opinion for Application No. PCT/US2015/048177 mailed on Dec. 10, 2015, 8 pages.

* cited by examiner

US 9,817,715 B2

RESILIENCY FRAGMENT TIERING

TECHNICAL FIELD

Several of the disclosed embodiments relate to data storage, and more particularly, to data storage architecture for enhanced storage resiliency.

BACKGROUND

Commercial enterprises (e.g., companies) and others gather, store, and analyze an increasing amount of data. The trend now is to store and archive almost all data before making a decision on whether or not to analyze the stored data. Although the per unit cost associated with storing data has declined over time, the total costs for storage has increased for many companies because of the volumes of stored data. Hence, it is important for companies to find cost-effective ways to manage their data storage environments for storing and managing large quantities of data. There are several problems with traditional approaches to capacity storage. Most traditional storage systems have difficulty scaling to support billions of values, which is far small than the trillions of objects that customers are storing today.

Traditional data protection mechanisms, e.g., RAID, are increasingly ineffective in petabyte-scale systems as a result of: larger drive capacities (without commensurate increases in throughput), larger deployment sizes (mean time between faults is reduced) and lower quality drives. The trends from the hard drive vendors are making traditional RAID increasingly difficult to implement, and are requiring complex techniques, e.g., triple parity, declustering. Some of the storage device trends that push away from traditional data protection mechanisms include: increasing drive sizes, lower I/O limits on drives, varying latency (which can slow I/O), varying capacity (within a given model/drive line, which can increase inefficiency of traditional RAID, lower drive reliability (increased failure rates, and more intense workload-triggered failures). Thus, the traditional data protection mechanisms are ill-suited for the emerging capacity storage market needs.

Further, the current data storage systems have complex data protection mechanisms, which typically involve performing a significant amount of I/O on the storage devices in order to provide a specified storage resiliency. This intensive I/O for protection purposes together with the I/O performed for providing data access to the customers wears the storage device much faster and therefore, decreases the lifespan of the device rapidly. To maintain the same storage resiliency, the storage devices may have to be replaced with new ones regularly, which can drive up the storage costs.

DETAILED DESCRIPTION

Figure 1A:
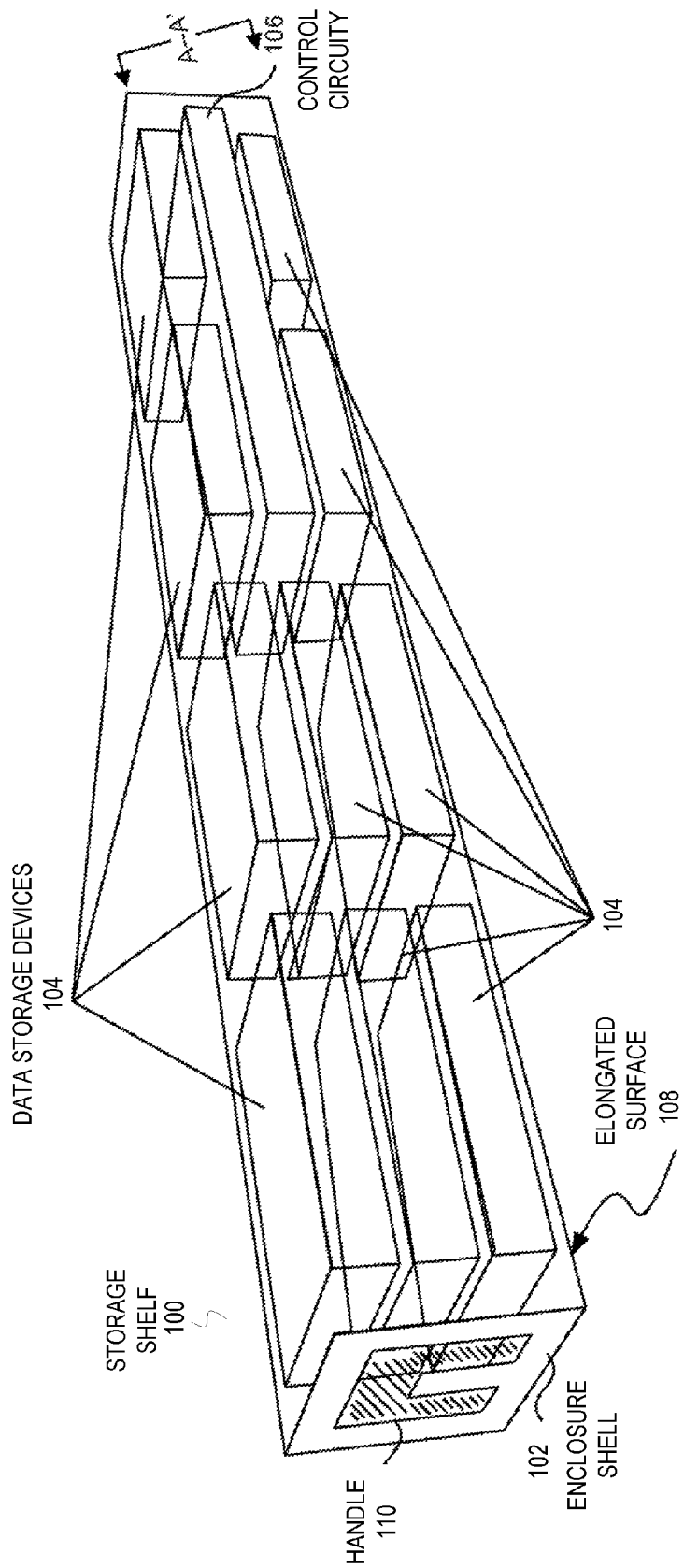
FIG. 1A is a perspective plan view of a storage shelf and components therein, consistent with various embodiments.

Technology is related to a data storage architecture for providing enhanced storage resiliency. Storage resiliency or data durability can be defined as a resistance to loss of one or more storage devices storing a portion of a data object or as a resistance to loss of one or more portions of the data object. The data storage architecture can be implemented in a single-tier configuration (also referred to as "wide spreading storage architecture") and/or a multi-tier configuration (also referred to as "hierarchical spreading storage architecture"). In either of the architecture, additional redundant portions of the data object are generated and stored across a number of storage devices, e.g., to provide storage resiliency for the data object, including at least one latent storage. The latent storage can be one or more optical discs, tapes, or a remote data center, e.g., a data center that provides online backup services. In some embodiments, the number of redundant portions generated depends on a specified storage resiliency. In some embodiments, the redundant portions are generated by encoding the data object based on an erasure coding method. The encoding of the data object generates a number of data object fragments, which include redundant fragments. The encoded data fragments are stored across various storage devices.

In the single-tier configuration of the data storage architecture, a storage system includes a number of storage devices, for example, hundreds or thousands of storage devices. A data object can be split into a number of fragments and stored across the storage devices. In some embodiments, the data object is encoded based on an erasure coding method to generate a number of fragments. The fragments are distributed across the storage devices. In some embodiments, the storage resiliency of the data object depends on a storage layout of the fragments. For example, if most of the fragments are stored on the same storage device or storage devices in a same storage shelf, the storage resiliency can be lower, as loss of the storage device or the storage shelf can result in higher probability of data loss. In another example, spreading the fragments widely across a large number of storage devices or storage shelves can have a better storage resiliency.

The number of encoded data fragments generated depends on a specified storage resiliency. In some embodiments, a ratio of the total number of fragments "n" generated to a minimum number of fragments "k" required for reconstructing the object is a function of the specified storage resiliency. For example, if n/k is 130%, then the storage resiliency is 30%. That is, the storage system can tolerate or resist loss of 30% of the data fragments without losing the data object. If the number of storage devices is more than n, the storage system can tolerate or resist loss of up to n of storage devices without losing the data. To obtain a storage resiliency of 30%, the storage system generates 30% redundant fragments for the purposes of data protection. For example, if the minimum number of fragments, k, is "1000," then the total number of fragments generated, n, is "1300", and the same system above would be able to tolerate "300" storage devices failing before data can be lost. This illustrates the importance to data protection of having a large n. The n data fragments are then spread widely across the storage devices. The storage resiliency can also be represented in the form of equation, n=k+m, where "k" is the original amount of data fragments or the minimum number of data fragments required to regenerate or rebuild the data object, and variable "m" stands for the extra or redundant fragments that are added to provide protection from failures. The variable "n" is the total number of fragments created after the encoding process. The data object can be reconstructed, e.g., in response to a request from a client system, by obtaining at least k encoded data fragments and decoding those to regenerate the data object.

In some embodiments, such storage resiliency can also be provided to metadata of the data object. The metadata of the data object can be stored with the data object and spread across various storage devices. This eliminates the need to store the metadata of the data objects in a separate repository from that of the data objects.

The single-tier storage architecture provides a number of benefits over existing architectures, e.g., RAID storage architecture. For example, in the single-tier architecture a write and/or read is spread across a large number of storage devices as opposed to a small set of storage devices in RAID. The writes and reads of the data fragments can be performed in parallel across the storage devices. Additionally, the number of reads performed on the storage devices can be further minimized as only a subset of the total number of data fragments is required to be read for regenerating the data object, thereby increasing a lifespan of the storage devices and lowering latency of access.

Further, the number of read-write operations performed on a particular storage device to regenerate the data fragments due to loss of one or more storage devices is minimized as the reads and writes are spread across the storage devices. For example, if a set of data fragments are lost due to failure of a storage device, the set of data fragments can be reconstructed by obtaining at least k data fragments from the remaining of the storage devices and generating the replacement data fragments as a function of the obtained data fragments. In some embodiments, the k data fragments are obtained from a first set of storage devices and the replacement data fragments are stored on a different set of storage devices, which distributes the read/write operations across different set of storage devices, thereby minimizing the read-write operations on a particular storage device and increasing the lifespan of the particular storage device.

Additionally, in the single-storage architecture, the mean-time-to-repair, which is how quickly the failed drive has to be repaired and the data stored in the failed drive to be reconstructed in order to provide a certain storage resiliency, is lower than that of current storage systems, e.g., RAID. Continuing with the above example of 30% storage resiliency with m equal to "300", the storage system can withstand loss of up to "300" drives. So the repair process can defer operation until a high percentage of those drives have failed. Similarly, the mean time between failure, which is a statistical measure of the time until a failure occurs, in the single-tier storage architecture is higher than that of current storage systems, e.g., RAID. For example, as described above since the storage system distributes the read/write operations across different sets of storage devices, the read-write operations on a particular storage device is minimized, which increases the lifespan of the particular storage device.

In the multi-tier configuration of the data storage architecture, the storage system includes a number of storage computer nodes which are each associated with a set of storage devices. The storage system encodes a data object into a number of data segments and distributes them to a number of storage computer nodes. Each of the storage computer nodes further encodes the data segment into a number of fragments and stores the fragments across storage devices associated with the storage computer node. For example, the storage system can encode the data object into "16" segments and send each of the "16" segments to different storage computer nodes. Each of the storage computer nodes can encode, independent of the other storage computer nodes, the segment into "16" fragments and store them across a set of storage devices associated with the storage computer node. The storage system can distribute the segments to a selected set of storage computer nodes and store the fragments at a selected set of storage devices based on a storage layout of the data object. The storage layout can be specified by a user, e.g., an administrator of the storage system, or calculated automatically based on operational characteristics of the storage system, e.g., capacity, load, wear, age and health.

The storage resiliency in multi-tier configuration of the data storage architecture is distributed between the tiers. For example, if storage resiliency in two level storage architecture is 30%, then the first tier of storage computer nodes could offer 15% storage resiliency, with the second tier of storage devices offering 15% storage resiliency. In some embodiments, this can mean that the storage system can generate 15% extra segments and 15% extra fragments for protection purposes.

In some embodiments, such storage resiliency can also be provided to metadata of the data object. The metadata of the data object can be stored with the data object and spread across various storage devices, which eliminates the need to store the metadata of the data objects in a separate repository from that of the data objects. For example, the metadata can be prefixed to the segments and/or fragments and stored across various storage devices.

One of the advantages of multi-tier storage architecture is localized data regeneration process. For example, if a storage device of a particular storage computer node fails, a fragment of a particular segment stored on the failed storage device can be regenerated using other fragments of the segment stored at other storage devices of the storage computer node. The storage system may not have to obtain fragments from other storage computer nodes. After the replacement fragment is generated, it can be stored at one of the remaining storage devices of the storage computer node. The reads and writes are restricted to the storage devices of a particular storage computer node. By restricting the reads and writes to the local storage devices of a storage computer node, the data traffic in the network, e.g., between storage computer nodes, is minimized, as is the amount of data that must be read from storage devices.

The storage system can store the data object across two or more tiers. For example, the storage system can have two tiers of storage computer nodes, where a first tier storage computer node can be associated with a number of second tier storage computer nodes and each of the second tier storage computer nodes can be associated with a set of storage devices. The data object is split into number of segments and the segments are sent to first tier storage computer nodes, where each first tier storage computer node splits the corresponding data segment into a number of fragments and distributes the fragments to a number of second tier storage computer nodes. Each of the second tier computer storage nodes splits the data fragment to a number of sub-fragments and stores the sub-fragments across a set of storage devices associated with the second tier storage computer node.

The storage devices of the storage system can be organized as storage shelves and storage racks, where each storage rack includes a number of storage shelves and each storage shelf includes a number of storage devices. The storage racks/shelves/devices can be distributed across various geographical locations.

Environment

FIG. 1A is a perspective plan view of a storage shelf 100 and components therein, consistent with various embodiments. The storage shelf 100 includes an enclosure shell 102 (partially shown) that encloses and protects multiple data storage devices 104. The data storage devices 104 may be hard drives, solid-state drives, flash drives, tape drives, or any combination thereof. It is noted that the term "enclose" does not necessarily require sealing the enclosure and does not necessarily require enveloping all sides of the enclosure.

The storage shelf 100 further includes control circuitry 106 that manages the power supply of the storage shelf 100, the data access to and from the data storage devices 104, and other storage operations to the data storage devices 104. The control circuitry 106 may implement each of its functions as a single component or a combination of separate components.

As shown, the storage shelf 100 is adapted as a rectangular prism that sits on an elongated surface 108 of the rectangular prism. Each of the data storage devices 104 may be stacked within the storage shelf 100. For example, the data storage devices 104 can stack on top of one another into columns. The control circuitry 106 can stack on top of one or more of the data storage devices 104 and one or more of the data storage devices 104 can also stack on top of the control circuitry 106.

In various embodiments, the enclosure shell 102 encloses the data storage devices 104 without providing window openings to access individual data storage devices or individual columns of data storage devices. In these embodiments, each of the storage shelves 100 is disposable such that after a specified number of the data storage devices 104 fail, the entire cartridge can be replaced as a whole instead of replacing individual failed data storage devices. Alternatively, the storage shelf 100 may be replaced after a specified time, e.g., corresponding to an expected lifetime.

The illustrated stacking of the data storage devices 104 in the storage shelf 100 enables a higher density of standard disk drives (e.g., 3.5 inch disk drives) in a standard shelf (e.g., a 19 inch width rack shelf). Each storage shelf 100 can store ten of the standard disk drives. In the cases that the data storage devices 104 are disk drives, the storage shelf 100A can hold the disk drives "flat" such that the spinning disks are parallel to the gravitational field.

The storage shelf 100 may include a handle 110 on one end of the enclosure shell 102 and a data connection port 112 (not shown) on the other end. The handle 110 is attached on an outer surface of the enclosure shell 102 to facilitate carrying of the storage shelf 100. The enclosure shell 102 exposes the handle 110 on its front surface. For example, the handle 110 may be a retractable handle that retracts to fit next to the front surface when not in use.

Figure 1B:
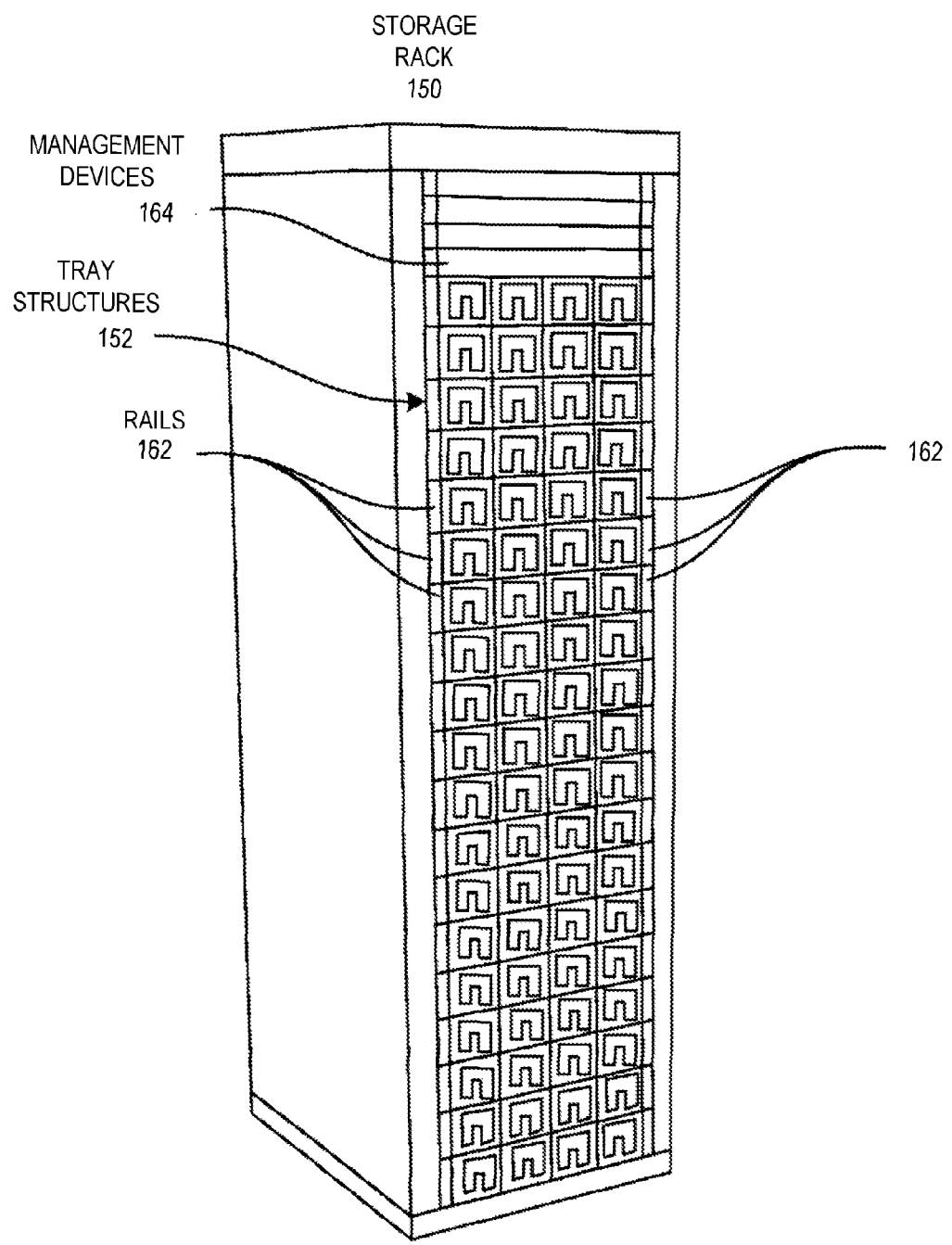
FIG. 1B is a perspective view of a storage rack of storage shelves, consistent with various embodiments.

FIG. 1B is a perspective view of a storage rack 150 of storage shelves, consistent with various embodiments. The storage shelves may be instances of the storage shelf 100 illustrated in FIG. 1A. The storage rack 150, as illustrated, includes a tray structure 152 (e.g., a rack shelf) securing four instances of the storage shelf 100. The tray structure 152 can be a standard 2U 19" deep rack mount. The storage rack 150 may include a stack of tray structures 152, each securely attached to a set of rails 162. Management devices 164 may be placed at the top shelves of the rack 150. For example, the management devices 164 may include network switches, power regulators, front-end storage appliances, or any combination thereof.

Figure 2:
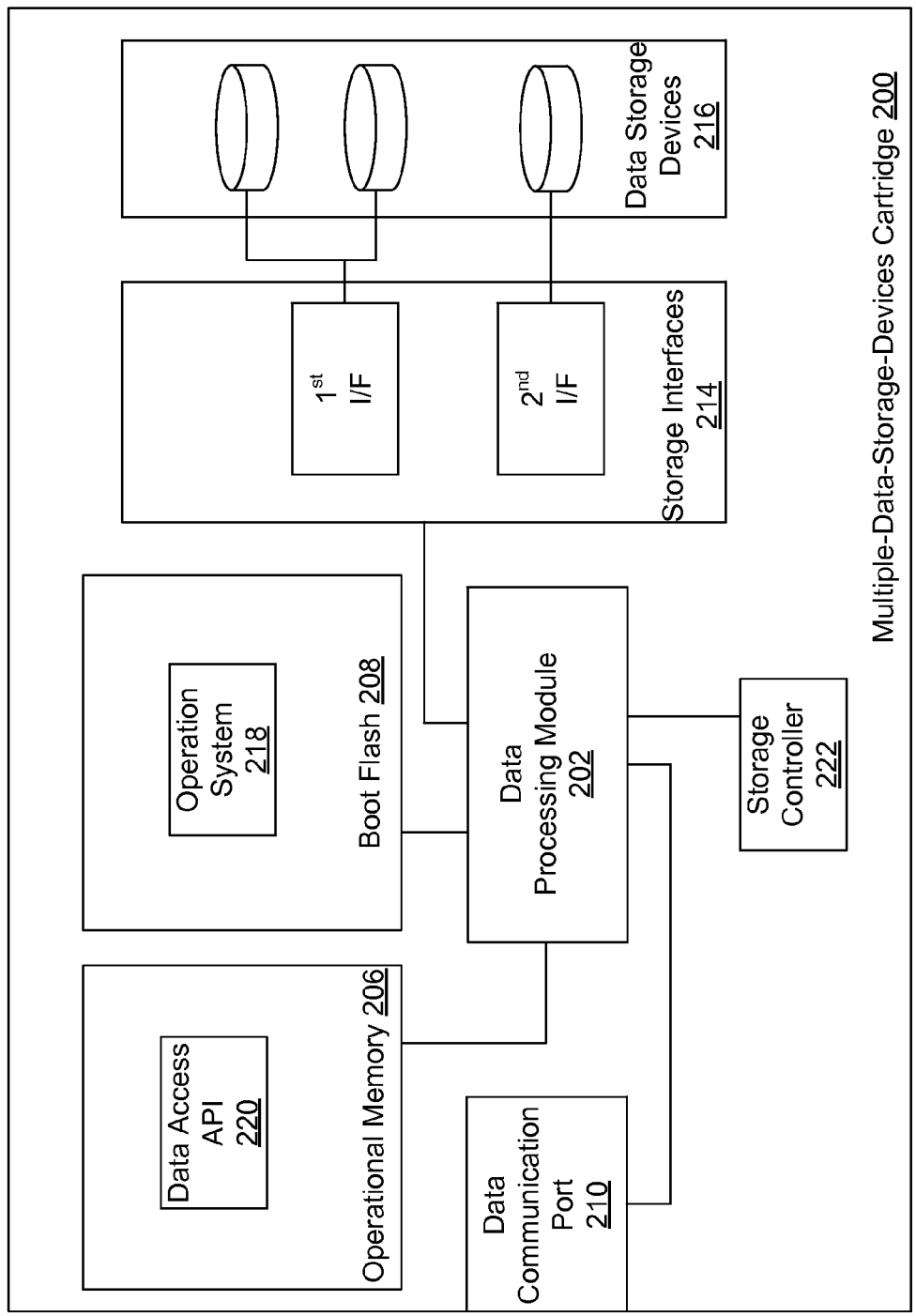
FIG. 2 is a block diagram of a storage shelf, in accordance with various embodiments.

FIG. 2 is a block diagram of a storage shelf 200, in accordance with various embodiments. In some embodiments, the storage shelf 200 is the storage shelf 100 of FIG. 1A. The storage shelf 200 includes a processor 202, an operational memory 206, a boot flash 208, a data communication port 210, a power management module 212, storage interfaces 214, and data storage devices 216.

The processor 202 can be a microprocessor, a controller, an application specific integrated circuit, a field programmable gate array, or any combination thereof. The boot flash 208 is a memory device storing an operating system 218. The processor 202 can load the operating system 218 into the operational memory 206 and run the operating system 218. A data access application programming interface (API) service 220 can execute on this operating system to provide data access over a network to the data storage devices 216 for clients (e.g., devices, applications, or systems).

The data communication port 210 enables the storage shelf 200 to connect with the network. For example, the data communication port 210 can be a Power-over-Ethernet module that connects to an Ethernet cable to both establish a network connection with the network and power the storage shelf 200.

In various embodiments, the storage shelf 200 only turns on a subset (hereinafter the "active set") of data storage devices 216 at a time. The active set can be a single data storage device or more than one data storage devices. The data access API service 220 can determine the membership of the active set depending on client requests received through the network. A client can either specifically request access to a data storage device or request a data range for the data access API service 220 to determine which data storage device stores the data range.

The power management module 212 provides electronic circuitry to switch on and off components of the storage shelf 200, e.g., to activate only one subset of the data storage devices at a time. The power management module 212 can receive instructions from the data processing module 202 (e.g., as part of the data access API service 220) to provide power to the designated active set, including a subset of the storage interfaces 214 that enables data access to the active set. Once power is supplied to the designated active set, the storage controller 222 can facilitate communicate between the data processing module 202 through the storage interface 214 to the data storage devices.

Figure 3:
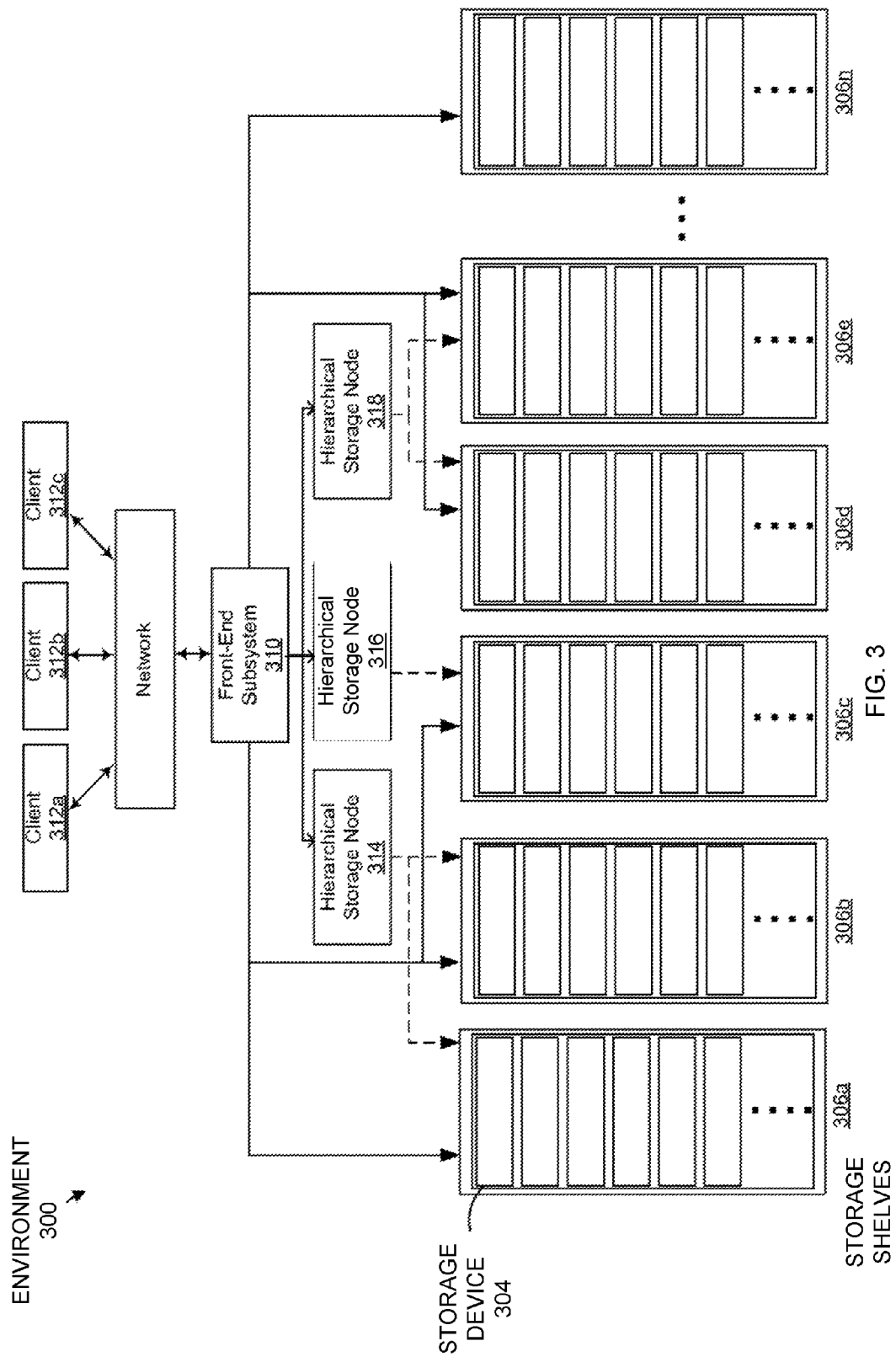
FIG. 3 is a block diagram illustrating an environment in which a data storage architecture can be implemented, consistent with various embodiments.

FIG. 3 is a block diagram illustrating an environment in which the data storage architecture can be implemented, consistent with various embodiments. The environment 300 includes a number of storage devices, e.g., storage device 304, which are organized as a number of storage shelves 306a-n (collectively referred to as "storage subsystem 306"). In some embodiments, each of the storage shelves in the storage subsystem 306 can be similar to the storage shelf 100 of FIG. 1A and each of the storage devices, including the storage device 304, can be similar to the data storage devices 104 or the data storage devices 216 of FIG. 2. Further, the storage shelves 306a-n can be part of one or more storage racks, e.g., storage rack 150. The storage subsystem 306 can be spread across various geographical locations.

The environment 300 includes one or more front-end subsystem 310 that facilitates storing and/or retrieving data from the storage subsystem 306. The front-end subsystem 310 processes the read/write requests from clients 312a-c (collectively referred to as "clients 312"). In some embodiments, the storage subsystem 306 is implemented as an object storage system, which manages data as data objects. The front-end subsystem 310 stores the data received from the clients as data objects in the storage subsystem 306. The front-end subsystem 310 can receive the data from the clients as data objects or in other formats. If the front-end subsystem 310 receives the data in other formats, it can convert the data into data objects before storing the data in the storage subsystem 306. In some embodiments, the front-end subsystem 310 also stores the metadata of the data with the data objects.

The environment 300 supports both single-tier configuration and multi-tier configuration of the data storage architecture. In the single-tier storage architecture, the front-end subsystem 310 encodes the data object, e.g., received from a client, to generate a number of data fragments and stores the data fragments across one or more of the storage devices of the storage subsystem 306. In some embodiments, the front-end subsystem encodes the data object based on an erasure coding method. In some embodiments, an erasure coding method encodes the data object to generate n fragments. The n fragments include some redundant fragments which are generated for storage resiliency/data protection purpose. The erasure coding requires at least k out of n fragments to generate the data object. In some embodiments, the ratio of n to k indicates a storage resiliency of the data object.

In the multi-tier storage configuration, the environment 300 includes one or more tiers of hierarchical storage nodes, e.g., hierarchical storage nodes 314-318. Each of the hierarchical storage nodes 314-318 can be associated with a set of storage devices. For example, the hierarchical storage node 314 is associated with storage devices from storage shelves 306a and 306b, the hierarchical storage node 316 is associated with storage devices from storage shelf 306c, and the hierarchical storage node 318 is associated with storage devices from storage shelves 306d and 306e.

In the multi-tier storage configuration, the front-end subsystem 310 encodes the data object, e.g., based on erasure coding, to generate a number of data segments and distributes them to a number of hierarchical storage nodes, e.g., hierarchical storage nodes 314-318. Each of the hierarchical storage nodes 314-318 further splits the data segment into a number of fragments and stores the fragments across storage devices associated with the hierarchical storage node. For example, the front-end subsystem 310 can split the data object into "3" segments and send each of the "3" segments to different hierarchical storage nodes 314-318. Each of the hierarchical storage nodes 314-318, e.g., hierarchical storage nodes 314 can split, independent of the other hierarchical storage nodes, the segment into "16" fragments and store them across a set of associated storage devices, e.g., storage devices from storage shelves 306a and 306b. The segments and fragments are distributed to a selected set of hierarchical storage nodes and storage devices, respectively, based on a storage layout of the data object. The storage layout can be specified by a user, e.g., an administrator of the storage system, or calculated automatically based on operational characteristics of the storage system, such as capacity, load, wear, age and health.

When a client system, e.g., client 312a, requests to access the data object, a front-end subsystem 310 determines the storage layout of the data segments, requests the identified hierarchical storage nodes, e.g., one or more of the hierarchical storage nodes 314-318, to obtain the fragments of a segment from the storage devices and decode them to generate the segment, and decodes the segments to generate the data object. The front-end subsystem 310 returns the data object to the client 312a. In some embodiments, the front-end subsystem 310 obtains at least the minimum number of segments required to regenerate the data object and the hierarchical storage nodes obtain at least the minimum number of fragments required to regenerate the data segment.

In some embodiments, both the single-tier configuration and multi-tier configuration of the data storage architecture can be implemented in the same storage system as illustrated in the environment 300. Further, in some embodiments, one of the two configurations is automatically and/or dynamically chosen for performing the read/write operations. A particular configuration can be selected based on a number of factors, e.g., type of data to be written, a client from whom the data is received, included metadata, etc. In some embodiments, the front-end subsystem 310 is configured to select the particular configuration based on the above factors.

Figure 4:
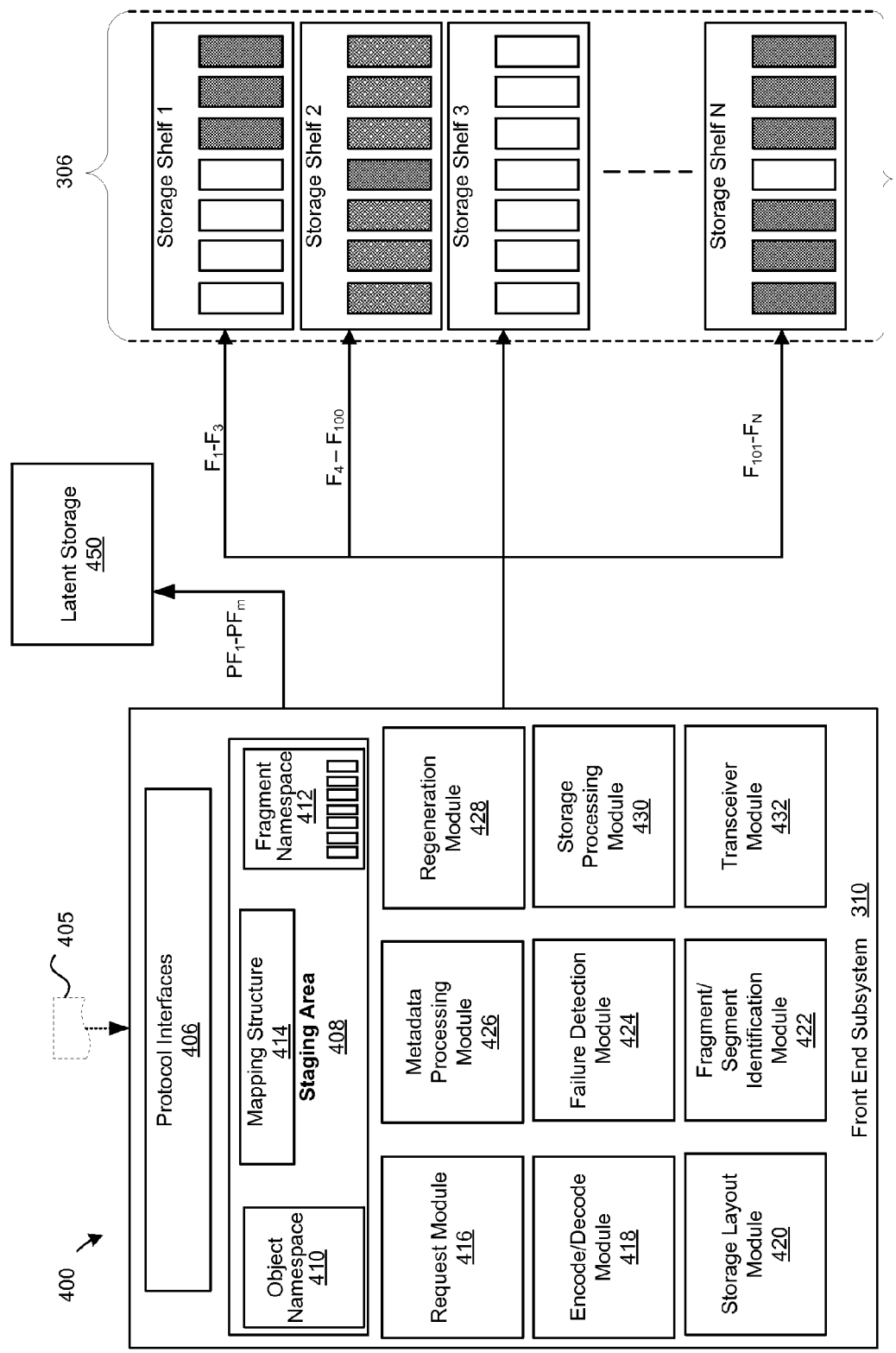
FIG. 4 is a block diagram of a storage system implementing wide spreading storage architecture, consistent with various embodiments.

FIG. 4 is a block diagram of storage system 400 implementing wide spreading storage architecture, consistent with various embodiments. In some embodiments, the storage system 400 can be implemented in the environment 300 of FIG. 3. The storage system 400 includes the front-end subsystem 310 that facilitates data storage and retrieval from the storage subsystem 306. The front-end subsystem 310 can be one or more computer systems (e.g., the computing device 1800 of FIG. 18), having either a shared nothing architecture or a shared database architecture, connected to the storage subsystems 306 over a network (e.g., a global network or a local network). The front-end subsystem 310 can be on a separate rack from the storage subsystem 306, or can be combined with the hierarchical storage node 314 or storage shelf 306.

The front-end subsystem 310 includes a protocol interfaces module 406. The protocol interfaces module 406 defines one or more functional interfaces that applications and devices use to store, retrieve, update, and delete data elements from the storage system 400. For example, the protocol interfaces module 406 can implement a Cloud Data Management Interface (CDMI), a Simple Storage Service (S3) interface, or both. The front-end subsystem 310 includes a staging area 408. The staging area 408 is a memory space implemented by one or more data storage devices within or accessible to the front-end subsystem 310. For example, the staging area 408 can be implemented by solid-state drives, hard disks, volatile memory, or any combination thereof. The staging area 408 can maintain an object namespace 410 to facilitate client interactions through the protocol interfaces module 406. The object namespace 410 manages a set of data container identifiers, e.g., object identifiers of data received from clients of the front-end subsystem 310. The staging area 408 also maintains a fragment namespace 412 corresponding to the object namespace 410. The fragment namespace 412 manages a set of fragment identifiers, each corresponding to a data fragment stored in the storage subsystem 306. The staging area 408 can store a mapping structure 414 that stores associations between the data container identifiers of the object namespace 410 and the fragment identifiers of the fragment namespace 412.

In some embodiments, the front-end subsystem 310 can be implemented as a distributed computing network including multiple computing nodes (e.g., computer servers). Each computing node can include an instance of the staging area 408. The namespaces (e.g., the object namespace 410 and the fragment namespace 412) of each staging area 408 can be implemented either as a share-nothing database or a shared database.

The staging area 408 can also serve as a temporary cache to process payload data from a write request received at the protocol interfaces module 406. The request module 416 receives read/write requests from the clients of the storage system 400. The front-end subsystem 310 processes an incoming write request by performing a number of storage efficiency processes on the payload data of the write request prior to sending the payload data into persistent storage in the storage subsystem 306. In some embodiments, the storage efficiency processes include deduplication, compression, fragmentation, erasure coding and fragment encryption of the payload data.

The storage processing module 430 performs the deduplication process on the payload data, which removes duplicate data portions from the payload data. The storage processing module 430 can use a number of deduplication techniques for deduplicating the payload data. The storage processing module 430 can compress the payload data, e.g., to reduce the storage space occupied by the payload data. The storage processing module can implement one or more compression algorithms for compressing the payload data.

The encode/decode module 418 fragments the payload data into a number of fragments, which includes redundant fragments for the purpose of data protection. In some embodiments, the encode/decode module 418 performs the encoding based on one or more erasure coding techniques. In some embodiments, erasure coding is a method of data protection in which payload data is broken into fragments, expanded and encoded with redundant data fragments. For example, payload data can be broken into k fragments and erasure coded data to generate n fragments, where n>k, such that the payload data can be recovered from a subset of the n, e.g., at least k fragments.

The storage processing module 430 can further encrypt the data fragments using one or more encryption techniques to generate encrypted data fragments. In some embodiments, the storage processing module 430 encrypts the fragments for data security purposes.

Note that the order of execution of storage efficiency processes is not restricted to the order described above. Alternative embodiments may perform these storage efficiency processes in a different order, and some processes may be removed, moved, added, subdivided, combined, and/or modified to provide alternatives or sub combinations.

The storage layout module 420 determines the storage layout of the data fragments. The storage layout identifies one or more of the storage racks, storage shelves of a rack and storage devices of a storage shelf the data fragments have to be stored in. In some embodiments, the storage layout module 420 determines the optimal layout of fragments to meet the service level object (SLO) promised to the client and/or to maximize storage resiliency, and sends the fragments to the selected storage devices of the storage subsystem 306 for storage. In some embodiments, a best storage layout stores each of the data fragments in a different storage device of the storage subsystem 306 to provide the best storage resiliency. In some embodiments, a worst storage layout stores all of the data fragments in the same storage device of the storage subsystem 306. Typically, the storage layout module 420 is configured to distribute the fragments across the storage devices as widely as possible, that is, to store distinct fragments on distinct storage devices.

In some embodiments, the storage layout module 420 selects the storage devices on a random basis. In some embodiments, the storage layout module 420 selects the storage devices on a random weighted basis. The storage layout module 420 can weigh the storage devices based on a number of factors, e.g., available storage capacity, a write latency of the storage device, a read latency of the storage device, a type of the storage device. For example, the storage layout module 420 can randomly select the storage devices from a set of storage devices that have at least some specified percentage of storage capacity free. In some embodiments, the random weighted basis attempts to store the data fragments evenly across the available storage devices. For example, one type of weighting is to decrease the weight if there are already a specified number of fragments stored on the storage device. In some embodiments, the random weighted basis randomly identifies the storage devices at which the encoded data fragments are to be stored as a function of decreasing the risk of data loss. For example, if a particular geographical region is prone to higher number of device failures, then the storage devices in that geographical region may be weighted less so that a lower number of fragments are written to the storage devices in that geographical region.

In some embodiments, the storage layout module 420 can select the storage devices based on parameters defined by a user, e.g., metadata, a client of the storage system 400, and/or an administrator of the storage system 400.

The following paragraphs describe additional details of writing data to the storage subsystem 306 in wide spreading storage architecture.

When a client, e.g., client 312a, sends a write request to the storage system 400, the request module 416 receives the request and extracts the data object to be written from the request. The storage processing module 430 performs a number of processes on the data object, e.g., as described above. The encode/decode module 418 encodes the data to generate n fragments. The encode/decode module 418 can use an erasure coding method, e.g., Reed-Solomon, FEC code, Fountain code, Raptor code, Tornado code.

In various embodiments, the storage layout module 420 can generate m additional protection fragments $PF_1$ to $PF_m$. A protection fragment is an extra fragment that is stored separately from the fragments that store data, e.g., in a latent storage 450. Examples of latent storage are optical discs, tapes, slow storage services in a remote data center, etc. The number m can be a number that is larger than k (e.g., the total number of fragments). By pre-computing the protection fragments and storing them separately from the storage subsystem 306, costs associated with regenerating lost fragments can be deferred, e.g., until data must be migrated to refresh or restore hardware in the storage subsystem 306. The quantity m can be computed, e.g., based on the expected life expectancy ("Mean Time to Failure, "MTTF") of the storage subsystem or its components, and/or based on the repair expectancy ("Mean Time to Repair, "MTTR") so that the protection fragments provide adequate protection until the hardware is projected to be refreshed or restored.

Because these additional protection fragments are not stored in the primary data access path between client devices 312 and storage subsystems 306, the protection fragments can be stored in devices or at services that offer a low throughput or service level and much lower costs, e.g., tapes, optical discs, online backup services, and so forth. The storage consumed by the protection fragments can be equal to the amount of storage expected to be lost between deployment of primary storage (e.g., storage subsystems 306) and a next hardware refresh, plus a small additional reserve to accommodate unexpectedly high failure possibilities. For example, with an annual failure rate of 5% with a four-year refresh cycle of a hard disk in a storage subsystem 306, 30% of the total storage would be required, storage consumption decreasing as protection fragments are checked out of latent storage 405 over time. These levels can be adjusted based on the customer's risk profile, and additional protection fragments can be subsequently added to replace protection fragments previously used.

In various embodiments, most fragments are written to storage subsystem 306 and some fragments (e.g., m fragments) are written to latent storage 450. Because random access is not required to the additional fragments, they only need to be accessed when there is a failure. For example, if a disk has failed and there are insufficient protection fragments stored in the storage subsystem 306, the additional fragments can be retrieved from the latent storage 450. Over time, storing the additional fragments in the latent storage 450 will be much more economical than storing all fragments in the storage subsystem 306.

In FIG. 4, the encode/decode module 418 splits the data object 405 into n fragments, $F_1$ to $F_N$. The storage layout module 420 determines the storage layout of the fragments and spreads the fragments, $F_1$ to $F_N$ across the storage devices of the storage subsystem 306. For example, the storage layout module 420 determines that the fragments, $F_1$ to $F_{99}$ have to be sent to the storage devices of "storage shelf 1," fragments, $F_{100}$ to $F_{199}$ to the storage devices of "storage shelf 2," and fragments, $F_{200}$ to $F_N$ to the storage devices of "storage shelf N." In some embodiments, the storage layout module 420 also determines the storage devices of the storage shelves where the fragments have to be stored. After the storage layout module 420 determines the storage layout, the transceiver module 432 transmits the data fragments to the corresponding storage shelves, which store the data fragments at the storage devices. In some embodiments, the fragments can be written to the different storage devices in parallel.

The number of fragments generated by the encode/decode module 418 depends on the required storage resiliency. The storage resiliency offered can be represented as n=k+m, where variable "k" is the original amount of data fragments or the minimum number of data fragments required to regenerate or rebuild the data object, and variable "m" stands for the extra or redundant fragments that are added to provide protection from failures. The variable "n" is the total number of fragments created after the encoding process.

Typically, in the wide spreading data storage architecture, the width to which the data object is split is wider, and the degree to which the data fragments are spread across the storage devices is wider, e.g., compared to current storage architecture such as RAID. For example, the number of fragments to which the data object is split into can be in hundreds and the number of storage devices across which the hundreds of fragments are spread across can be in the thousands to tens of thousands.

In some embodiments, a ratio of "n" to "k" indicates the storage resiliency provided for the data object. For example, if n/k is 130%, then the storage resiliency is 30%. That is, the storage system can tolerate or resist loss of 30% of the data fragments without losing the data object. If the number of storage devices is more than n, the storage system can tolerate or resist loss of up to n of storage devices without losing the data. For example, if the minimum number of fragments, k, is "1000," then the total number of fragments generated, n, is "1300.", and the same system above would be able to tolerate "300" storage devices failing before data can be lost. This illustrates the importance to data protection of having a large n. To obtain a storage resiliency of 30%, the storage system generates 30% redundant fragments for the purposes of data protection. For example, if the minimum number of fragments, k, is "1000," then "m" is "300" and n is "1300." The n data fragments are then spread widely across "4000" storage devices.

The object identifier of the data object and the fragment identifiers of the fragments are stored in the staging area 408 at the object namespace 410 and the fragment namespace 412, respectively. Further, a mapping of the object identifier to the fragment identifiers can be stored in the mapping structure 414 of the staging area 408.

When a read request arrives at the storage system 400 from the client 312a for the data object, the data object can be reconstructed by obtaining at least k number of the $F_N$ data fragments and decoding them to regenerate the data object. The transceiver module 432 obtains the storage layout of the fragments from the storage layout module 420 and obtains the data fragments from the identified storage devices of the storage subsystem 306. The storage layout module 420 can use the mapping structure 414 to obtain the fragment identifiers of the data object and then determine the storage devices at which the corresponding fragments are stored.

The transceiver module 432 can obtain from k to n number of fragments. For example, the transceiver module 432 can stop fetching the fragments after obtaining the first k fragments. In another example, the transceiver module 432 can fetch all the n fragments but use only the first k fragments for regenerating the data object.

Further, the transceiver module 432 can preferentially select a subset of the storage devices identified by the storage layout module 420 to obtain the fragments from. The transceiver module 432 selects a storage device based on a number of factors, e.g., read latency of storage device, type of the storage device, number of pending read requests ahead of the current read request in a read request queue of the storage device, how far away the storage device is. Accordingly, the transceiver module 432 may not even read some of the storage devices that contain the data fragments of the data object, thereby minimizing read/write operation on the storage device. In some embodiments, the transceiver module 432 can obtain the fragments from different storage devices in parallel.

After obtaining the data fragments, the encode/decode module 418 decodes the data fragments, e.g., based on the erasure coding used to encode the data object, to generate the data object. In some embodiments, the storage processing module 430 may perform additional processes on the decoded object before returning the data object to the client 312a. For example, the storage processing module 430 can perform decompression and de-deduplication on the decoded data object if the data object was deduplicated and compressed.

The wide spreading storage architecture provides a robust storage resiliency to the data stored in the storage subsystem 306. The wide spreading storage architecture also provides an efficient way to rebuild the data fragments in case of storage device failures. When a storage device fails, the data fragments stored at the storage device may be lost. When a failure detection module 424 detects a failure or impending failure of a storage device, the failure detection module 424 requests the regeneration module 428 to evacuate readable fragments or rebuild unreadable or lost data fragments to compensate for the ones that are no longer reliably stored. The regeneration module 428 facilitates rebuilding of new data fragments of a data object using the remaining data fragments of the data object stored at other storage devices. For example, if a storage device in "storage shelf 2" storing the data fragments $F_4$-$F_{10}$ fails, the regeneration module 428 can rebuild up to new six data fragments and writes the new data fragments to any of the remaining set of storage devices. In some embodiments, the regeneration module 428 rebuilds the data fragments using sufficient number of the remaining data fragments $F_1$-$F_3$ and $F_{11}$-$F_N$. The regeneration module 428 can use the encoding method used to generate the initial fragments to generate the new replacement fragments.

The failed storage device can store data fragments of one or more data objects. The fragment/segment identification module 422 can determine the fragments stored on the storage device that failed, e.g., using the storage layout. The regeneration module 428 can rebuild the data fragments of all the data objects whose fragments are lost or for only a set of data objects that have lost the data fragments. For example, the regeneration module 428 can rebuild the data fragments of a data object whose current storage resiliency is lesser than a specified threshold for minimum storage resiliency. The current storage resiliency is determined as a function of the remaining of "n" number of fragments and "k." For example, if the specified threshold for minimum storage resiliency of a data object is 10% and the current storage resiliency is less than 10%, then the data fragments can be rebuilt for the data object. Further, the regeneration module 428 can start rebuilding the data fragments of the data object whose current storage resiliency is lesser than the specified threshold instantaneously, e.g., in response to the failure of the storage device. The regeneration module 428 can rebuild the data fragments of other data objects whose current storage resiliency exceeds the specified threshold at a later time. In some embodiments, the regeneration module 428 executes the rebuilding process as a background process of the front-end subsystem 310. In some embodiments, a user, e.g., administrator of the storage system 400 can manually execute the rebuilding process.

The wide spreading storage architecture can resist higher number of storage device failures than that of current storage systems, e.g., RAID storage system. For example, if the storage system 400 offers a storage resiliency of 30% and has a k of 1000, then the storage system 400 can resist a failure of "300" storage devices before the data is lost. So if one or more storage devices are lost, or even if an entire storage shelf/storage rack is lost, there may not be much impact on the storage resiliency. This provides a number of advantages. First, the rebuilding process may not have to be started immediately; it can be done at a later time. The storage resiliency of the lost data fragments can be repaired over time, e.g., when the work load (data read-write operations) on the storage system 400 is below a threshold, or when the current storage resiliency drops below the specified threshold, e.g., when the current storage resiliency is less than 10%—which means the storage system 400 can only tolerate failure of "200" more storage devices. That is, the wide spreading storage architecture offers a high mean time to repair, e.g., compared to RAID storage architecture.

Second, the wide spreading storage architecture separates the rebuilding of data fragments from replacement of the failed storage devices. That is, the storage system 400 may not have to wait until the failed storage devices are replaced to rebuild the data fragments. The rebuilding process reads the data fragments of the data object from the remaining storage devices, generates new data fragments as a function of the data fragments obtained from the other storage devices, and writes the new data fragments on one or more of the remaining storage devices. Accordingly, in the wide spreading storage architecture, the storage system 400 does not have to wait for the failed storage device to be replaced to rebuild the data fragments, unlike current storage architectures, e.g., RAID storage architecture without hot spares, where a failed storage device may have to be replaced immediately upon failure.

However, if the failed storage device is replaced immediately upon failure, the storage system 400 can use the replacement storage device as additional capacity, e.g., to store new data. Further, the replacement storage device can be of different storage capacity and/or type from that of the failed storage device.

The wide spreading storage architecture also minimizes the number of read-write operations required per storage device for rebuilding the data fragments of a particular data object. The regeneration module 428 obtains the remaining data fragments of the particular data object from other storage devices of the storage subsystem 306. Since the data fragments are spread over a number of storage devices, the number of read operations performed for the rebuilding process is spread across many storage devices and therefore, the number of read operations performed on a particular storage device is limited. Further, in some embodiments, the regeneration module 428 obtains less than the remaining number of fragments, e.g., k fragments of the remaining fragments, to rebuild the lost data fragments, which further minimizes the read operations performed on the storage devices. By minimizing the read operations on a given storage device, the wear of the storage device is minimized and the lifespan of the storage device is therefore, increased. Further, as rebuild can be deferred and performed after many failures have occurred, rebuild operations are minimized compared to architectures were rebuilds are initiated for each failure operation.

Furthermore, after rebuilding the new data fragments, the new data fragments are written to a set of storage devices. In some embodiments, the set of storage devices to which the data is written is different from the set of storage devices from which the data fragments are read to rebuild the data fragments. Accordingly, the read-write operations performed on any given storage device is minimized, which minimizes the wear of the storage device and therefore, increases the lifespan of the storage device.

As described above, the wide spreading storage architecture provides optimum storage resiliency to data stored in the storage devices of the storage subsystem 306 while minimizing the wear of the storage devices.

Figure 5:
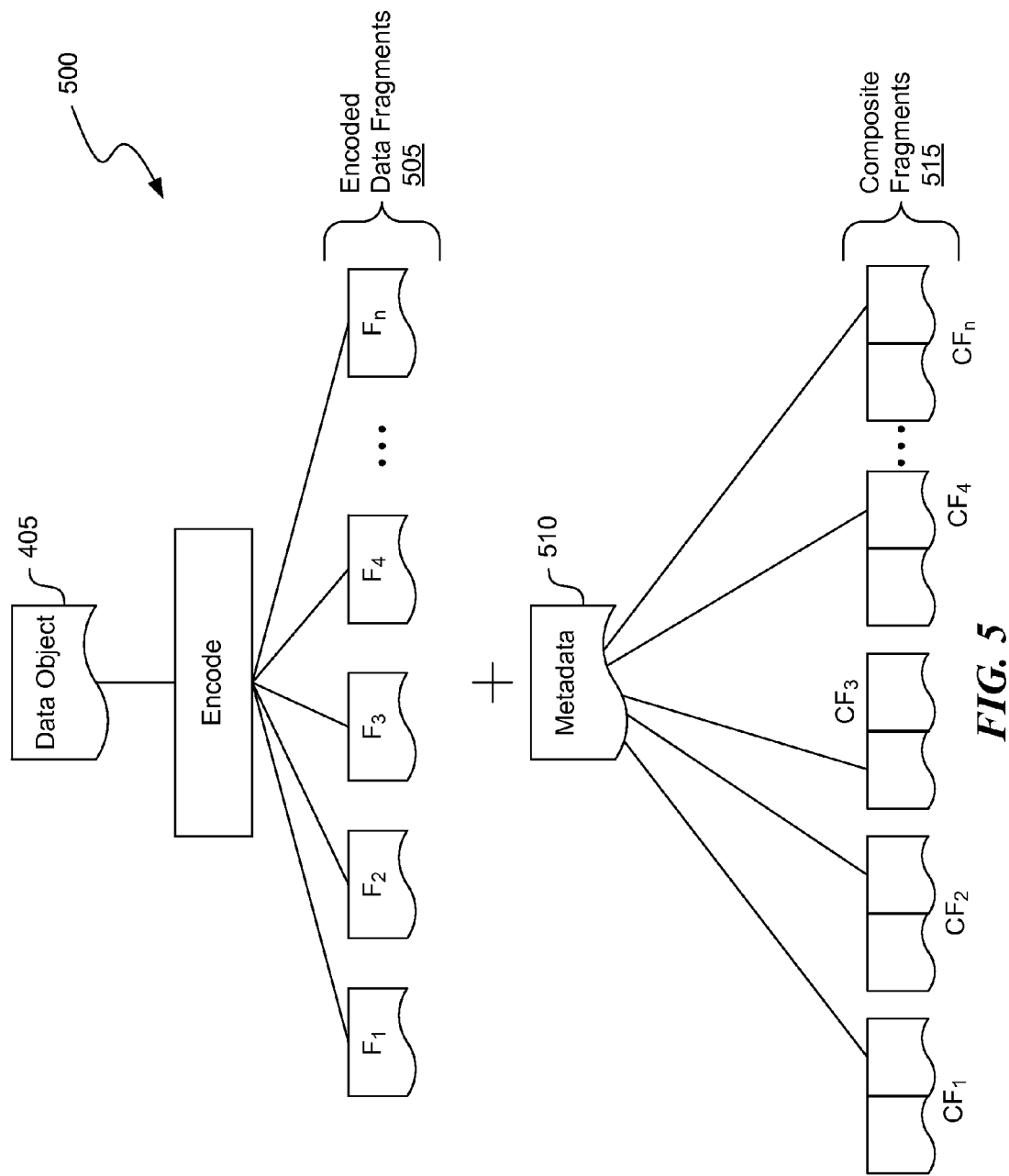
FIG. 5 is a block diagram for storing metadata of a data object with the data object in a storage system of FIG. 4, consistent with various embodiments.

The wide spreading storage architecture can also be used to store metadata of the data object. FIG. 5 is a block diagram 500 for storing metadata of a data object with the data object in a storage system 400 of FIG. 4, consistent with various embodiments. The wide spreading storage architecture can provide the same storage resiliency to the metadata of a data object that is provided to the data object. Examples of metadata can include, object ID, object size, object owner, creation time, created by, modified by, etc. The metadata can also include client-specified metadata, e.g., author of an object, name of entity, etc. Typically, current storage architectures store metadata separate from the data object. The wide spreading storage architecture enables storing the metadata with data object, thereby eliminating the need to have a separate database for the metadata, the need to have specific infrastructure to ensure the metadata is consistent with the data, etc.

When a write request is received, the payload data in the write request is analyzed to obtain the metadata 510 and the data portion, e.g., data object 405. The data object 405 is then encoded, e.g., using encode/decode module 418 as described with reference to FIG. 4, to generate a number of fragments 505. The metadata 510 is combined with some or each of the fragments 505, e.g., concatenated or prefixed to each of the fragments 505, to generate composite fragments 515. The composite fragments 515 can then be stored in the storage subsystem 306 by spreading them across a number of storage devices, e.g., similar to storing the data fragments as described with reference to FIG. 4. In some embodiments, the metadata 510 can be a subset of the metadata of the data object 405.

In some embodiments, by including the metadata 510 with the data object, the possibility of inconsistency between the metadata 510 and the data object 405 is eliminated. Further, since the metadata 510 is attached to the fragments 505, the composite fragments 515 can be moved across locations/storage devices without having to update the metadata 510 and without risking the consistency between the metadata 510 and the data object 405.

Another benefit of storing the metadata 510 with the data object 405 is that since a separate database and/or metadata server is not needed to maintain the metadata 510, the read and write operations are relatively faster since no separate read/write is required to read/write the metadata 510. In some embodiments, metadata retrieval is also simplified since a method call that is used for retrieving the data object 405 can be modified to use retrieve the metadata 510, which can simplify a number of functions performed related to the metadata 510.

Figure 6:
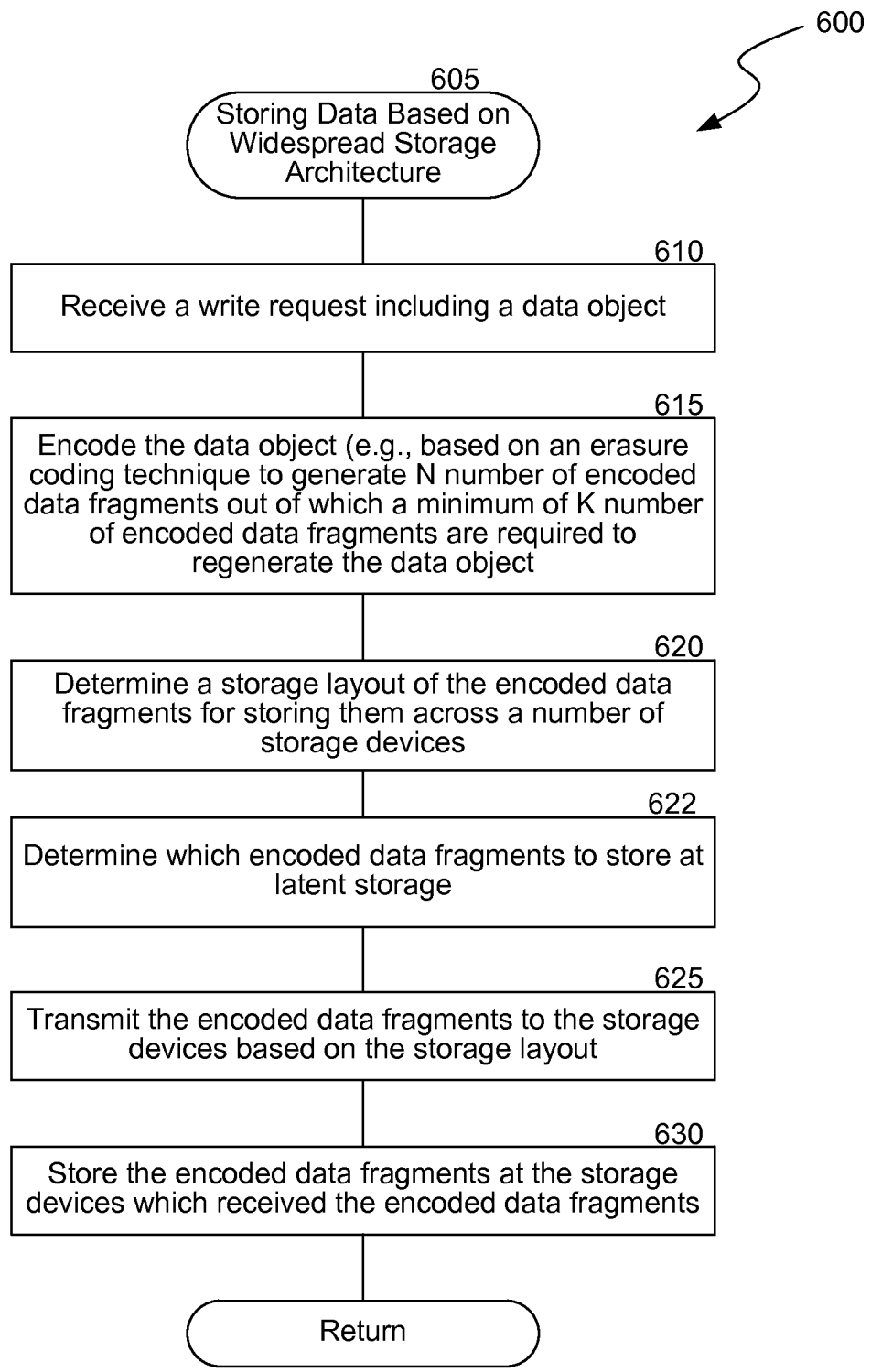
FIG. 6 is a flow diagram of a process of storing data to an object-based storage system using the wide spreading storage architecture, consistent with various embodiments of the disclosed technology.

FIG. 6 is a flow diagram of a process 600 of storing data to an object-based storage system using wide spreading storage architecture, consistent with various embodiments of the disclosed technology. In some embodiments, the process 600 may be implemented in environment 300 of FIG. 3, and using the storage system 400 of FIG. 4. The process 600 begins at block 605, and at block 610, a request module 416 of the frontend subsystem 310 receives a write request including payload data. In some embodiments, the payload data includes data portion and metadata of the data. If the data portion is not in a format suitable for storing in an object storage system, e.g., storage subsystem 306, the frontend subsystem 310 converts the data portion to the suitable format, e.g., as the data object.

At block 615, the encode/decode module 418 encodes the data object to generate a number of encoded data fragments, e.g., encoded data fragments F1-FN. In some embodiments, the encode/decode module 418 encodes the data object based on an erasure coding technique. The number of encoded data fragments generated can be expressed as a function, e.g., n=k+m, where variable "k" is the original amount of data fragments or the minimum number of data fragments required to regenerate or rebuild the data object, and variable "m" is the number of extra or redundant fragments added to provide protection from storage device failures. The variable "n" is the total number of fragments created after the encoding process.

After the encoded data fragments are generated, a mapping of the object identifier of the data object and fragment identifiers of the encoded data fragments are stored in the mapping structure 414.

In some embodiments, apart from encoding the data object to generate the fragments, various other processes may be performed on the data object, e.g., deduplication, compression, encryption. One or more of these processes can be performed by the storage processing module.

At block 620, the storage layout module 420 determines a storage layout for storing the encoded data fragments across a number of storage devices, e.g., storage devices of storage subsystem 306. In some embodiments, the storage layout module 420 is configured to spread the encoded data fragments across as many storage devices as possible, e.g., to provide better storage resiliency to the data object. That is, the storage layout module 420 attempts to identify different storage devices for storing different encoded data fragments. In some embodiments, the storage layout module 420 selects the storage devices on a random basis. In some embodiments, the storage layout module 420 selects the storage devices on a random weighted basis.

At block 622, the storage layout module 420 determines which encoded fragments to store at a latent storage, e.g., latent storage 450. As an example, the storage layout module may receive or have stored a value indicating what proportion or quantity of fragments to store at the latent storage.

At block 625, the transceiver module 432 transmits the encoded data fragments to the identified storage devices. For example, the transceiver module 432 can transmit the encoded data fragments to the storage shelves and/or the storage racks which contain the storage devices.

At block 630, the storage shelves and/or the storage racks store the encoded data fragments at the identified storage devices, and the process 600 returns. In some embodiments, the front-end subsystem 310 also stores the metadata of the data object with the data object. Additional details with respect to the process of storing the metadata are described at least with reference to FIGS. 9 and 10.

Figure 7:
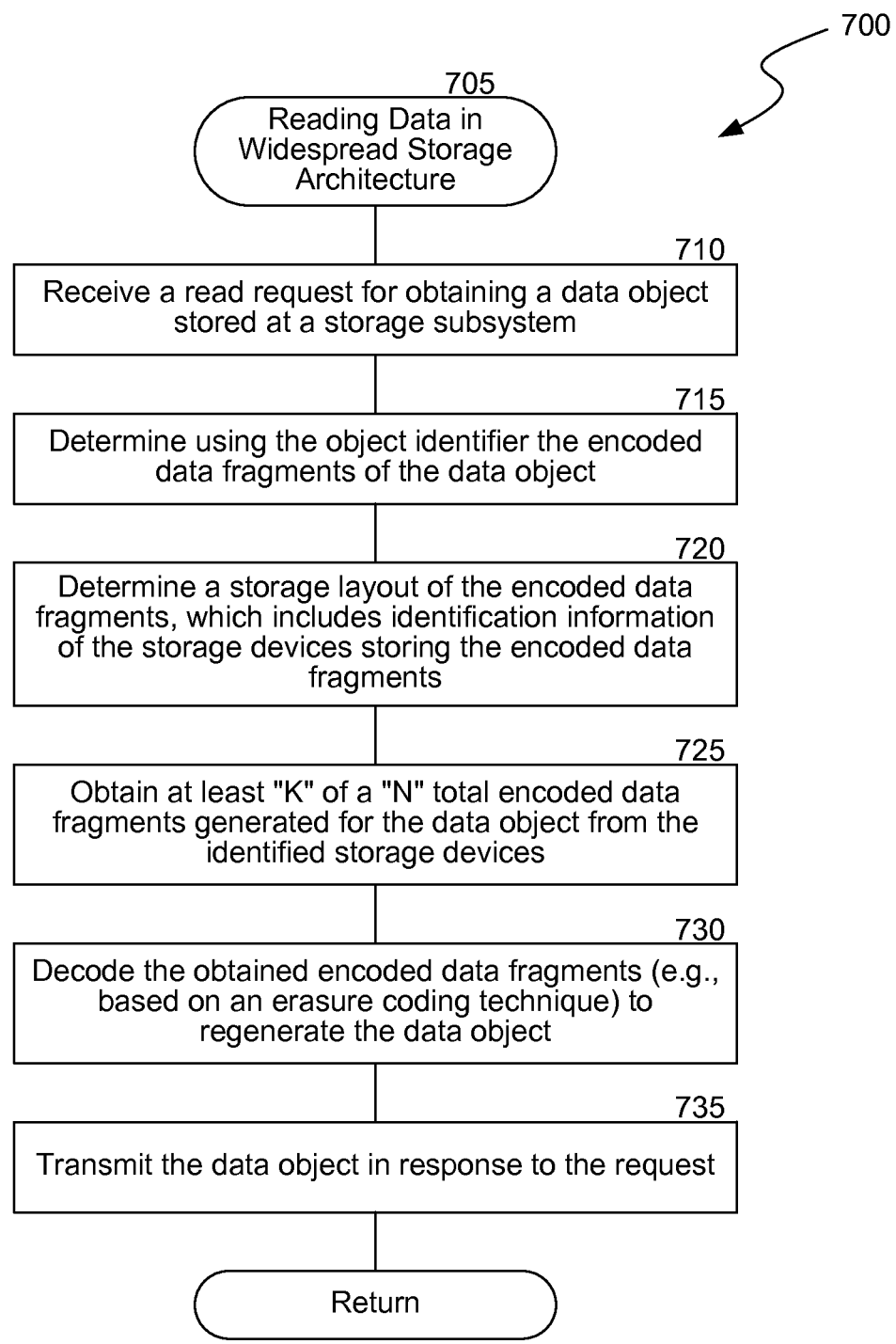
FIG. 7 is a flow diagram of a process of reading data from an object-based storage system using the wide spreading storage architecture, consistent with various embodiments of the disclosed technology.

FIG. 7 is a flow diagram of a process 700 of reading data from an object-based storage system using wide spreading storage architecture, consistent with various embodiments of the disclosed technology. In some embodiments, the process 700 may be implemented in environment 300 of FIG. 3, and using the storage system 400 of FIG. 4. The process 700 begins at block 705, and at block 710, a request module 416 of the frontend subsystem 310 receives a read request, e.g., from a client system 312a, for obtaining a data object. In some embodiments, the read request includes an object identifier of the data object.

At block 715, the fragment/segment identification module 422, determines the encoded data fragments of the data object using the object identifier. In some embodiments, a mapping of the object identifier and the fragment identifiers of the encoded data fragments are stored in the mapping structure 414.

At block 720, the storage layout module 420 determines the storage layout of the encoded data fragments using the mapping obtained from the mapping structure. The storage layout can include identification information of the storage devices where each of the encoded data fragments is stored. In some embodiments, the storage layout information can also include identification information of the storage racks and/or storage shelves of the storage devices where the encoded data fragments are stored.

At block 725, the transceiver module 432 obtains sufficient number of the encoded data fragments required to generate the data object from the identified storage devices. In some embodiments, the sufficient number of encoded data fragments is k number of the encoded data fragments. In some embodiments, the transceiver module 432 can obtain k to n number of fragments. For example, the transceiver module 432 can stop fetching the fragments after obtaining the first k fragments. In another example, the transceiver module 432 can fetch all the n fragments but use only the first k fragments for regenerating the data object.

Further, the transceiver module 432 can preferentially select a subset of the identified storage devices to obtain the fragments from. The transceiver module 432 can select a storage device based on a number of factors, e.g., read latency of a storage device, type of the storage device, number of pending read requests ahead of the current read request in a read request queue of the storage device, a geographical location of the storage device. In some embodiments, the transceiver module 432 can obtain the fragments from different storage devices in parallel.

After obtaining the encoded data fragments, at block 730, the encode/decode module 418 decodes the encoded data fragments, e.g., based on the erasure coding method used to encode the data object, to generate the data object.

At block 735, the transceiver module 432 transmits the data object in response to the read request, e.g., to the client system 312a, and the process 700 returns. In some embodiments, additional processes may be performed before decoding the data fragments. For example, the storage processing module 430 can decrypt the encoded data fragments if they were encrypted before being stored. In some embodiments, additional processes may be performed on the decoded data object before returning the data object to the client 312a. For example, the storage processing module 430 can perform decompression and de-deduplication on the decoded data object if the data object was deduplicated and compressed.

Figure 8:
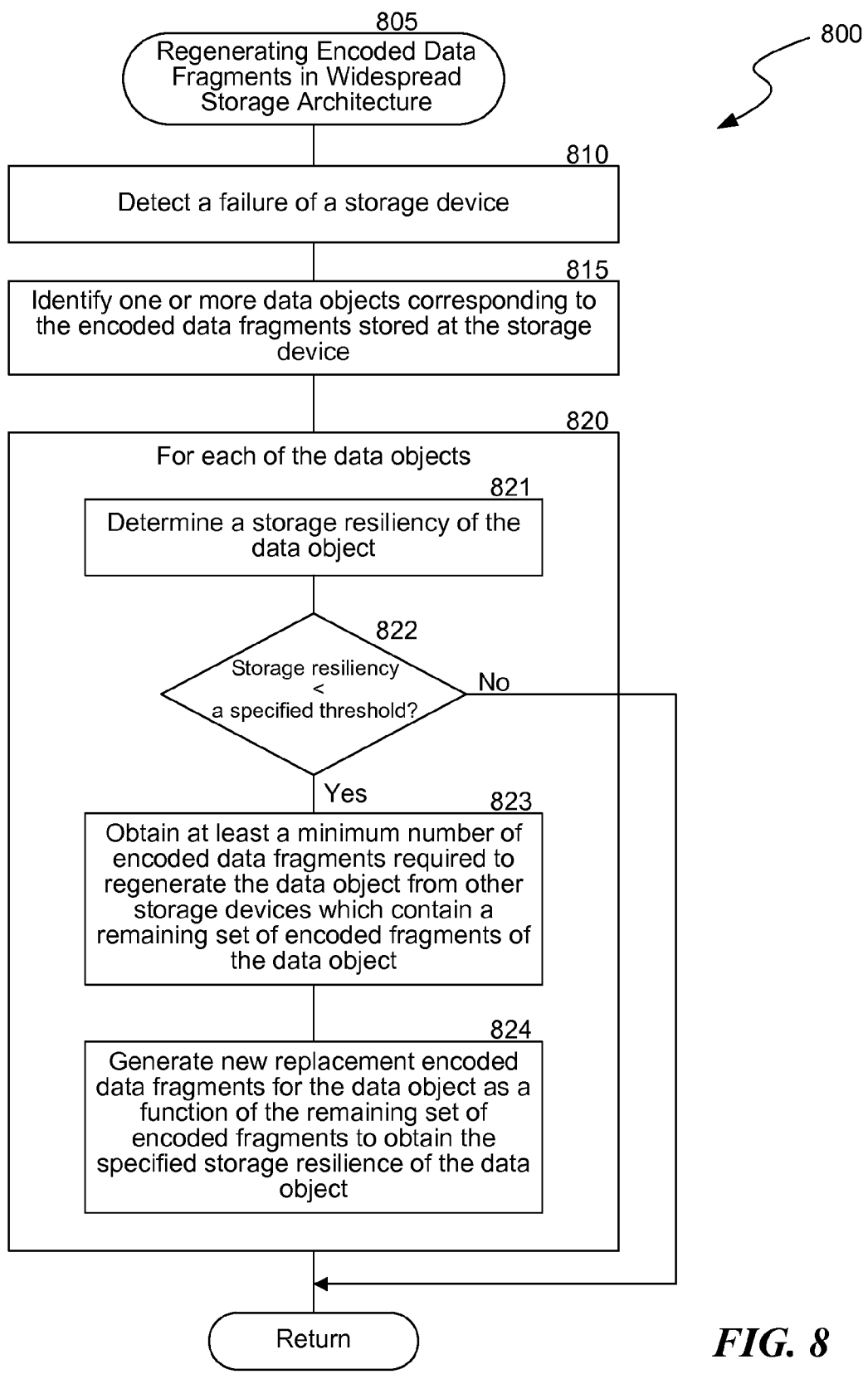
FIG. 8 is a flow diagram of a process of rebuilding data fragments of a data object in the wide spreading storage architecture, consistent with various embodiments of the disclosed technology.

FIG. 8 is a flow diagram of a process 800 of rebuilding data fragments of a data object in wide spreading storage architecture, consistent with various embodiments of the disclosed technology. In some embodiments, the process 800 may be implemented in environment 300 of FIG. 3, and using the storage system 400 of FIG. 4. In some embodiments, the data fragments stored in the storage subsystem 306 may be lost due to a failure of a storage device. The process 800 begins at block 805, and at block 810, a failure detection module 424 of the frontend subsystem 310 detects a failure of a storage device, e.g., storage device 304. In some embodiments, the failure can be one or more of the storage device being not accessible, the storage device being physically damaged, etc.

At block 815, the fragment/segment identification module 422 identifies the encoded data fragments that were stored at the storage device. For example, the fragment/segment identification module 422 can refer to the storage layout module 420 to determine the fragments stored at the storage device that has failed. Further, the fragment/segment identification module 422 identifies the one or more data objects corresponding to the identified encoded data fragments. For example, the fragment/segment identification module 422 can refer to the mapping structure 414 to determine the data objects associated with the identified encoded data fragments.

At block 820, the regeneration module 428 rebuilds some or all of the encoded data fragments that was stored at the storage device that failed. In some embodiments, rebuilding the data fragments include performing the method described in association with blocks 821-824 for each of the identified data objects. At block 821, the regeneration module 428 computes the current storage resiliency of the data object. In some embodiments, storage resiliency is defined as a resistance to loss of one or more storage devices storing a portion of a data object or resistance to loss of one or more portions of the data object. In some embodiments, a current storage resiliency of a data object is determined as a function of the number of fragments remaining out of "n" fragments and "k." For example, if n is "130," k is "100," then the number of redundant fragments, m is "30," and therefore, the storage resiliency can be calculated as 30% (100*m/k). Note that the storage resiliency can be calculated using other functions and based on several other parameters.

The storage system 400 may guarantee a storage resiliency range to the clients of the storage system, for example, a minimum storage resiliency and a maximum storage resiliency. In some embodiments, the storage resiliency range is part of the SLO guaranteed to the clients. In some embodiments, the storage system 400 may not rebuild the lost data fragments until the current storage resiliency of the data object drops below the minimum storage resiliency.

At determination block 822, the regeneration module 428 determines if the current storage resiliency of the data object is less than the minimum storage resiliency. Continuing with the above example of a storage resiliency of 30%, if the minimum storage resiliency is 10%, then the storage system 400 can withstand loss of "20" data fragments, in which case m is "10."

Responsive to a determination that the current storage resiliency of the data object is not less than the minimum storage resiliency, the process 800 returns. On the other hand, responsive to a determination that the current storage resiliency is less than the minimum storage resiliency, at block 823, the transceiver module 432 obtains sufficient number of fragments of the data object from remaining of the storage devices. The transceiver module 432 may use the storage layout to identify the storage devices that store the data fragments of the data object. In some embodiments, the transceiver module 432 can obtain the minimum number of fragments required to rebuild the data fragments.

At block 824, the regeneration module 428 regenerates the data fragments as a function of the obtained data fragments and stores the regenerated data fragments in at least a subset of the remaining storage devices. In some embodiments, the regeneration module 428 regenerates as many data fragments as required to meet a specified storage resiliency, which can be up to the maximum storage resiliency. In some embodiments, regenerating the data fragments as a function of the obtained data fragments includes encoding the obtained data fragments to generate the new/replacement/additional data fragments. In some embodiments, regenerating the data fragments as a function of the obtained data fragments includes decoding the obtained data fragments to generate the data object and encoding the generated data object to generate the specified number of data fragments. If a sufficient number of data fragments are found in the storage subsystem 360, additional fragments may be retrieved from latent storage 450 to proactively replace lost fragments.

In various embodiments, if an insufficient number of data fragments are found in the storage subsystem 360, additional fragments may be retrieved from latent storage 450, e.g., sufficient to regenerate the data.

Figure 9:
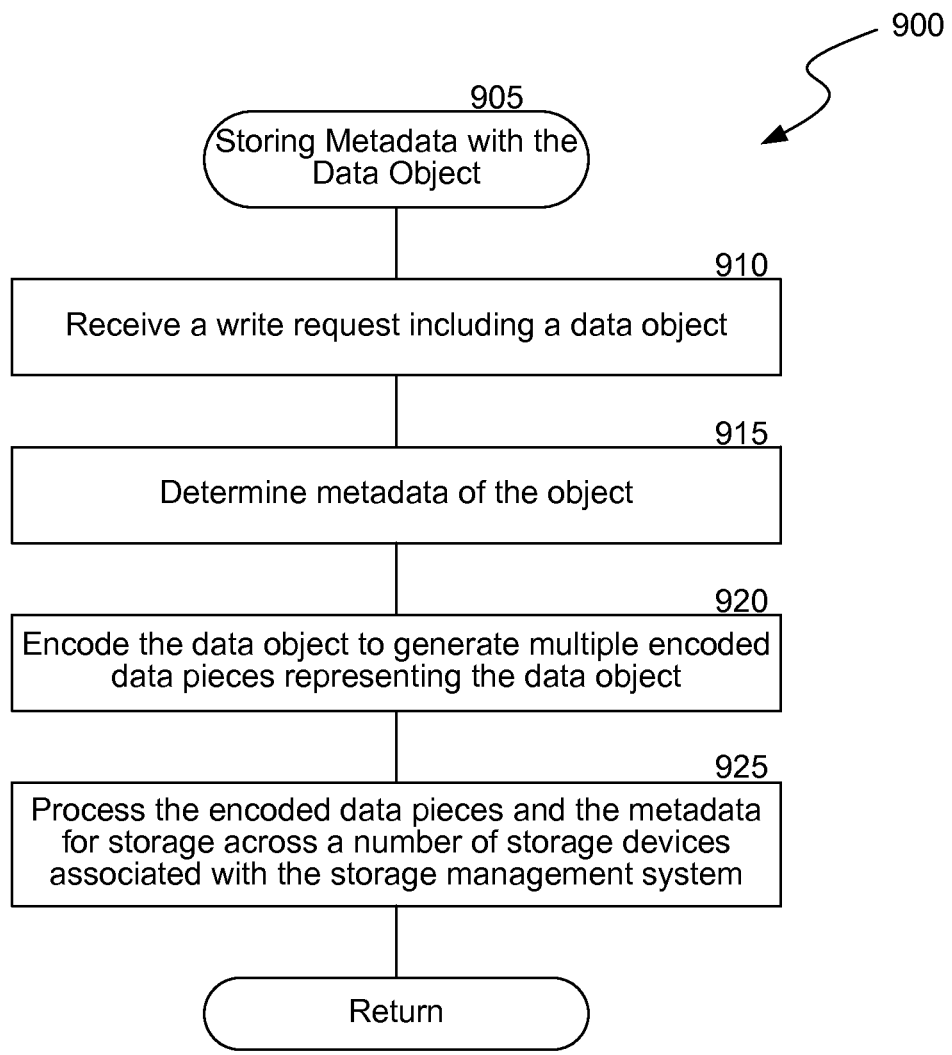
FIG. 9 is a flow diagram of a process of storing metadata of a data object with the data object in the wide spreading storage architecture, consistent with various embodiments of the disclosed technology.

FIG. 9 is a flow diagram of a process 900 of storing metadata of a data object with the data object in wide spreading storage architecture, consistent with various embodiments of the disclosed technology. In some embodiments, the process 900 may be implemented in environment 300 of FIG. 3, and using the storage system 400 of FIG. 4. The process 900 begins at block 905, and at block 910, a request module 416 of the frontend subsystem 310 receives a write request including payload data. In some embodiments, the payload data includes data portion and metadata of the data. If the data portion is not in a format suitable for storing in an object storage system, e.g., storage subsystem 306, the frontend subsystem 310 converts the data portion to the suitable format, e.g., as the data object.

At block 915, the metadata processing module 426 analyzes the payload data to obtain the metadata of the data object, e.g., metadata 510 of FIG. 5. Examples of metadata can include, object ID, object size, object owner, creation time, created by, modified by, etc. The metadata can also include client-specified metadata, e.g., author of an object, name of entity, etc.

At block 920, the encode/decode module 418 encodes the data object to generate a number of encoded data pieces, e.g., segments and/or fragments. In some embodiments, the encode/decode module 418 encodes the data object as described at least with reference to FIGS. 4-6.

At block 925, after the encoded data pieces are generated, the metadata processing module 426 processes the encoded data pieces and the metadata for storage across a number of storage devices, e.g., storage devices of the storage subsystem 306, and the process 900 returns. Additional details with respect to the method of processing the metadata are described at least with reference to FIG. 10.

Figure 10:
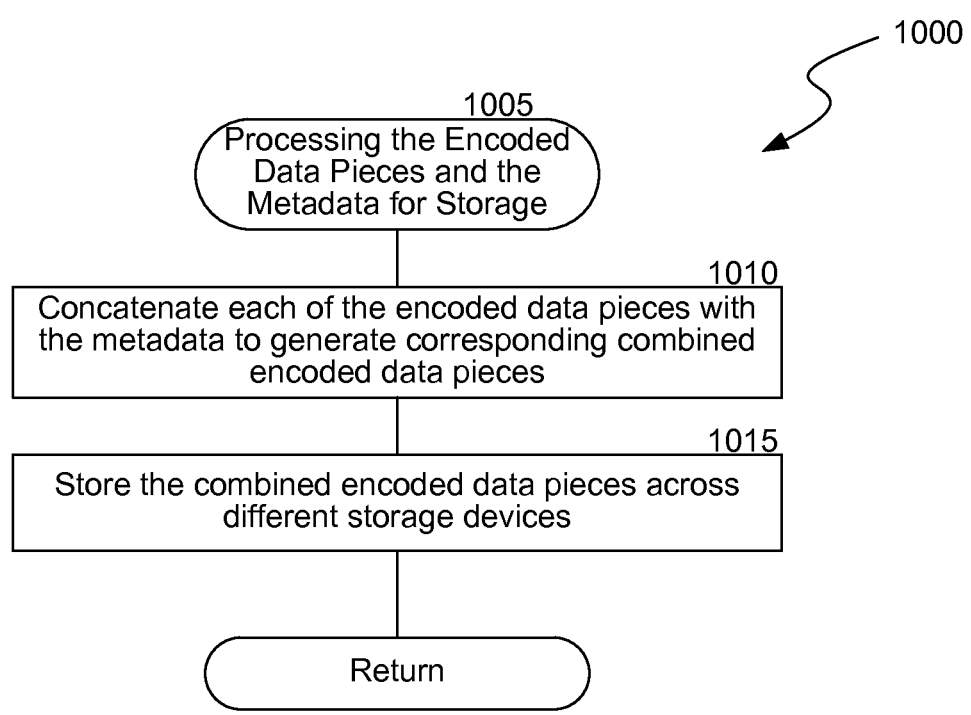
FIG. 10 is a flow diagram of a process of processing metadata and data fragments of a data object in the wide spreading storage architecture, consistent with various embodiments of the disclosed technology.

FIG. 10 is a flow diagram of a process 1000 of processing metadata and data fragments of a data object in wide spreading storage architecture, consistent with various embodiments of the disclosed technology. In some embodiments, the process 1000 may be implemented in environment 300 of FIG. 3, and using the storage system 400 of FIG. 4. In some embodiments, the process 1000 implements the method of block 925 of FIG. 9. The data piece generated in the process 900 of FIG. 9, e.g., in block 920, can be considered as a data fragment in the wide spreading storage architecture. The process 1000 begins at block 1005, and at block 1010, the metadata processing module 426 combines each of the data fragments of the data object with the metadata, e.g., metadata 510, to generate composite encoded data fragments, e.g., composite encoded data fragments 515. In some embodiments, combining the metadata with each of the fragments includes concatenating or prefixing the metadata to each of the fragments.

After the composite fragments are generated, at block 1015, the transceiver module 432 transmits the composite fragments to the storage subsystem 306 for storing across a number of storage devices, e.g., similar to storing the data fragments as described at least with reference to blocks 620-630 of FIG. 6, and the process 1000 returns. Prior to transmitting the composite fragments to the storage subsystem 306, the storage layout module 420 determines a storage layout for storing the composite data fragments across the number of storage devices, e.g., similar to determining the storage layout for storing the data fragments as described at least with reference to FIG. 4 and block 620 of FIG. 6. The transceiver module 432 then transmits the composite data fragments to the identified storage devices.

Figure 11:
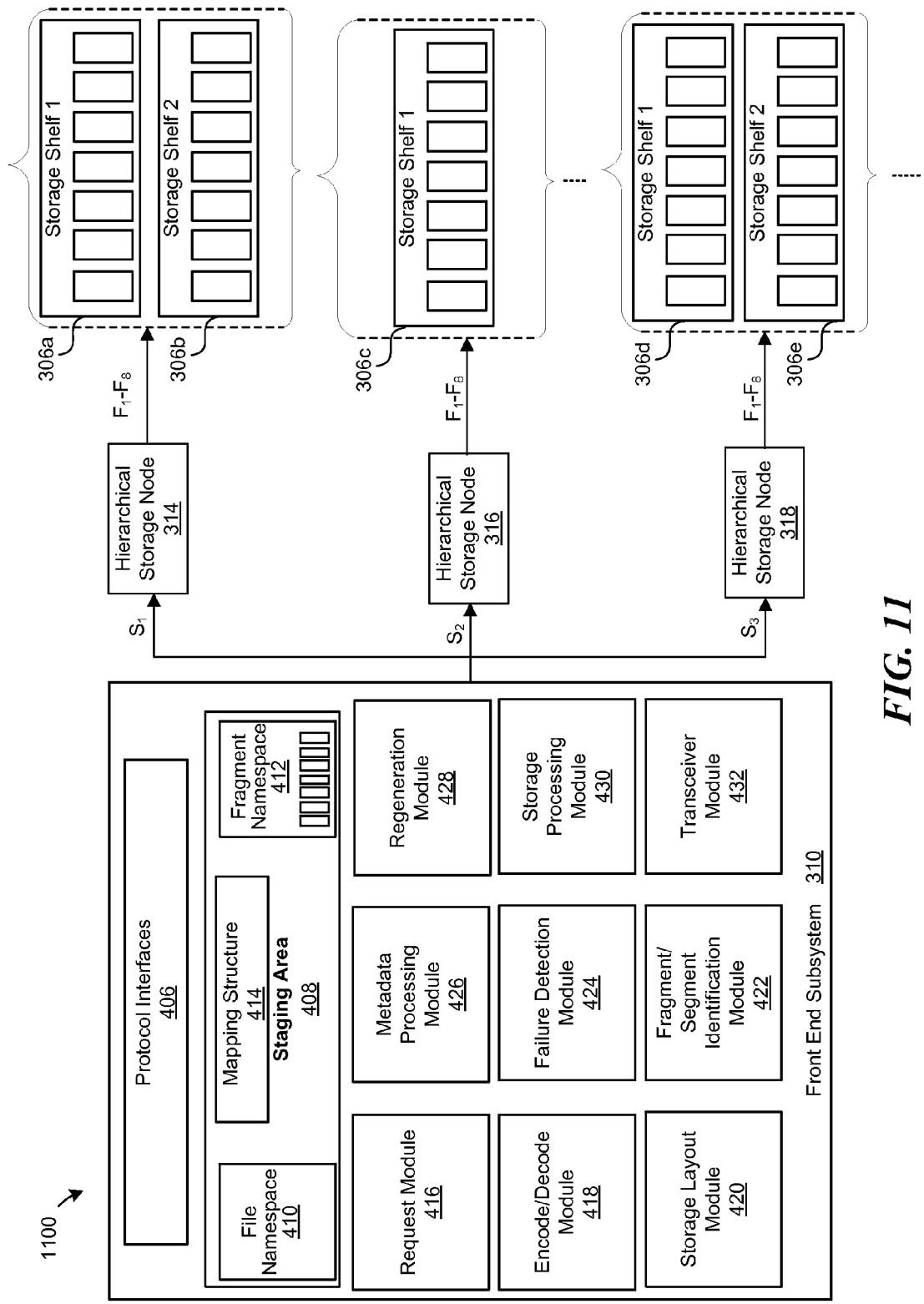
FIG. 11 is a block diagram of a storage system implementing hierarchical spreading storage architecture, consistent with various embodiments.

FIG. 11 is a block diagram of storage system 1100 implementing hierarchical spreading storage architecture, consistent with various embodiments. In some embodiments, the storage system 1100 can be implemented in the environment 300 of FIG. 3. Further, in some embodiments, the storage system 1100 includes at least some of the characteristics, behavior/functionalities of the storage system 400 of FIG. 4. In some embodiments, the wide spreading storage architecture of storage system 400 can also be implemented in the storage system 1100. The storage system 1100 includes the front-end subsystem 310 and a tier of hierarchical storage nodes, e.g., hierarchical storage nodes 314-318 that facilitate data storage and retrieval from the storage subsystem 306, which includes storage shelves 306a-n. The hierarchical storage nodes can be implemented in a similar configuration to that of the front-end subsystem 310. For example, a hierarchical storage node can include the modules/components of the front-end subsystem 310 depicted in FIG. 3. Note that although FIG. 11 depicts one tier of hierarchical storage nodes, the hierarchical spreading storage architecture can have more than one tier of hierarchical storage nodes.

Each of the hierarchical storage nodes 314-318 can be associated with a set of storage devices. For example, the hierarchical storage node 314 is associated with storage devices from storage shelves 306a and 306b, the hierarchical storage node 316 is associated with storage devices from storage shelf 306c, and the hierarchical storage node 318 is associated with storage devices from storage shelves 306d and 306e. In some embodiments, the hierarchical storage nodes are spread across various geographical locations. In other embodiments, the hierarchical storage nodes are integrated into each storage shelf.

The following paragraphs describe additional details of writing data to the storage subsystem 306 in hierarchical spreading storage architecture.

When a client, e.g., client 312a, sends a write request to the storage system 1100, the request module 416 receives the request and extracts the data object to be written from the request. The encode/decode module 418 encodes the data object to generate a number of segments, e.g., "S1," "S2," and "S3". In some embodiments, the encode/decode module 418 can use wide spreading, or an erasure coding method directly, e.g., Reed-Solomon, FEC coding, Fountain code, Raptor code, Tornado code, to generate the segments. In some embodiments, the number of segments generated is a function of the number of hierarchical storage nodes.

The transceiver module 432 distributes the data segments to a number of hierarchical storage nodes, e.g., hierarchical storage nodes 314-318. The storage layout module 420 determines the storage layout of the segments, that is, the hierarchical storage nodes to which the segments have to be distributed, and the transceiver module 432 spreads the segments to the identified the hierarchical storage nodes. In some embodiments, the storage layout module 420 is configured to select different hierarchical storage nodes for different segments, e.g., to maximize storage resiliency of the data object. However, in some embodiments, more than one segment may be transmitted to a hierarchical storage node. In some embodiments, the storage layout module 420 determines the hierarchical storage nodes to which the segments have to be distributed on a random basis. The storage layout can also be specified by a user, e.g., an administrator of the storage system 1100. In FIG. 11, the segment, "S1" is sent to the hierarchical storage node 314, the segment "S2" is sent to the hierarchical storage node 316 and the segment "S3" is sent to the hierarchical storage node 318. In some embodiments, the segments are transmitted to the hierarchical storage nodes in parallel.

The number of segments generated by the encode/decode module 418 can also depend on the required storage resiliency. The storage resiliency offered can be represented as n'=k'+m', where variable k' is the original amount of data segments or the minimum number of data segments required to rebuild the data object, and variable m' stands for the extra or redundant segments added to provide protection from failures, e.g., failures of hierarchical storage nodes and/or storage devices associated with hierarchical storage nodes. The variable n' is the total number of segments created after the encoding process.

The segment identifiers of the data object may be stored in the fragment namespace 412. The mapping structure 414 can store a mapping of the object identifier of the data object to the segment identifiers of the segments of the data object.

In some embodiments, prior to encoding the data object, the storage processing module 430 can perform a number of storage efficiency processes on the data object, e.g., as described at least with reference to FIG. 4.

Each of the hierarchical storage nodes 314-318 can encode, independent of the other hierarchical storage nodes, the segment, e.g., based on an erasure coding method, to generate a number of fragments of the segment. In some embodiments, the hierarchical storage node encodes the segment using an encode/decode module similar to the encode/decode module 418. In FIG. 11, the segments "S1," "S2," and "S3," are each encoded to generate eight fragments F1-F8. Each of the hierarchical storage node stores the fragments, F1 to F8, across the storage devices of the storage subsystem 306. In some embodiments, the techniques involved in encoding a data segment to generate the fragments of a segment and storing the fragments across the storage devices is similar to the techniques involved in encoding a data object to generate the fragments of the data object and storing the fragments across the storage devices in wide spreading storage architecture, e.g., as described at least with reference to FIGS. 4 and 6.

For storing the fragments across a set of storage devices, the hierarchical storage node determines a storage layout of the fragments. The storage layout identifies one or more of the storage racks, storage shelves of a rack and storage devices of a storage shelf the data fragments have to be stored in. In some embodiments, the hierarchical storage node determines the storage layout of the fragments using a storage layout module similar to the storage layout module 420. After the storage layout is determined, the hierarchical storage node stores the fragments in the identified storage devices. In some embodiments, the hierarchical storage node writes the fragments to the different storage devices in parallel. In the hierarchical spreading storage architecture, the writes are more efficient than current storage systems. For example, in addition to writing the fragments of a particular segment in parallel, all the hierarchical storage nodes can write the fragments of their corresponding segments in parallel.

The hierarchical storage node stores the segment identifier of the data segment and the fragment identifiers of the fragments of the data segment in a staging area similar to the staging area 408. Further, the hierarchical storage node stores a mapping of the segment identifier of a segment to the fragment identifiers of the segment in a mapping structure similar to the mapping structure 414.

In the hierarchical spreading storage architecture, the storage resiliency provided for a data object is split across the tiers of a storage system. For example, if the storage resiliency offered for a data object by the storage system 1100 is 30%, then the first tier—hierarchical storage node 314-318 provides 15% of the storage resiliency and the second tier—storage devices provided the other 15%. The amount of storage resiliencies provided by each of the tiers can be configurable. However, the sum of storage resiliencies offered by the tiers may not exceed the total storage resiliency offered by the storage system 1100.

Referring to the read requests, when a read request arrives at the storage system 1100 from the client 312a for a particular data object, the data object can be reconstructed by obtaining at least k' number of the n' data segments and decoding them to regenerate the data object. The transceiver module 432 obtains the storage layout of the segments from the storage layout module 420 and obtains the data segments from the identified hierarchical storage nodes. The storage layout module 420 can obtain the segment identifiers of the segments of the data object from the mapping structure 414 and then determine from the storage layout the hierarchical storage nodes at which the corresponding segments are stored.

After the hierarchical storage nodes are identified, the transceiver module 432 requests the hierarchical storage nodes to return the data segments of the data object. The transceiver module 432 can obtain k' to n' number of segments for generating the data object. For example, the transceiver module 432 can stop fetching the segments after obtaining the first k' segments. In another example, the transceiver module 432 can fetch all the n' segments but use only the first k' segments for regenerating the data object. Further, the transceiver module 432 can preferentially select a subset of identified the hierarchical storage nodes to obtain the segments from. The transceiver module 432 selects a hierarchical storage node based on a number of factors, e.g., a latency of the hierarchical storage node, a workload of the hierarchical storage node, a geographical location of the storage device. In some embodiments, the transceiver module 432 can obtain the segments from different storage nodes in parallel.

When a particular hierarchical storage node receives a request from the front-end subsystem 310 for a data segment, the hierarchical storage node obtains the fragments of the data segment from the storage devices associated with the hierarchical storage node. The hierarchical storage node determines the storage layout of the fragments and obtains a sufficient number of the data fragments, e.g., the minimum number data fragments required to generate the data segment, from the identified storage devices.

Further, the hierarchical storage node can preferentially select a subset of the storage devices to obtain the fragments from. The hierarchical storage node selects a storage device based on a number of factors, e.g., read latency of storage device, type of the storage device, number of pending read requests ahead of the current read request in a read request queue of the storage device, how far the storage device is. Accordingly, the hierarchical storage node may not even read some of the storage devices that contain the data fragments of the data object, thereby minimizing read/write operations on a particular storage device. In some embodiments, the hierarchical storage node can obtain the fragments in parallel.

After obtaining the data fragments, the hierarchical storage node decodes the data fragments, e.g., based on the erasure coding used to encode the data segment, to generate the data segment, and then returns the data segment to the front-end subsystem 310. In some embodiments, the hierarchical storage node may perform additional processes on the decoded data segment before returning it to the front-end subsystem 310. For example, the hierarchical storage node can perform decompression and de-deduplication on the decoded data segment if the data segment was deduplicated and compressed.

After the front-end subsystem 310 obtains sufficient number of the data segments from the hierarchical storage nodes, the front-end subsystem 310 decodes the data segments to generate the data object, and returns the data object to the client system 312a. In some embodiments, the storage processing module 430 may perform additional processes on the decoded data object before returning the data object to the client 312a. For example, the storage processing module 430 can perform decompression and de-deduplication on the decoded data object if the data object was deduplicated and compressed.

As described above, the hierarchical spreading storage architecture distributes the storage resiliency provided to the data across the storage tiers—hierarchical storage nodes 314-318 and storage devices of the storage subsystem 306. One of the advantages of such a distributed storage resiliency is that the storage system 1100 can withstand the loss of either some of the hierarchical storage nodes or some of the storage devices of a hierarchical storage node, or in some cases, both.

Another advantage of the hierarchical spreading storage architecture is that the rebuilding process can be localized in some cases. That is, when a storage device associated with a particular hierarchical storage node fails, the data fragments of a segment stored at the failed storage device may be rebuilt using the remaining data fragments of the segment stored within the storage shelves of the particular hierarchical storage node. The storage system 1100 may not have to obtain the fragments from the storage devices associated with another hierarchical storage node. For example, when a fragment F1 of the segment S1 is lost due to a failure of a storage device in the storage shelves 306a-b, the hierarchical storage node rebuilds a new data fragment for the data segment S1 using the remaining data fragments, F2-F8, stored at other storage devices within the storage shelves 306a-b. In some embodiments, the hierarchical storage node uses sufficient number of the data fragments, e.g., k number of the remaining data fragments to rebuild the new data fragment. The hierarchical storage node can use the encoding method used to generate the initial fragments to regenerate the new data fragment.

Localizing the rebuilding process to a particular hierarchical storage node minimizes the network traffic, e.g., between the hierarchical storage nodes and the front-end subsystem 310, between the hierarchical storage nodes, that might otherwise occur if the fragments are to be read from storage devices apart from that of the particular hierarchical storage node. This saves the time required for the fragments to traverse the network and therefore, can make the rebuilding process faster and more efficient. Further, localizing the rebuilding process to the storage devices of the particular hierarchical storage node, the read-write operations performed on storage devices of other hierarchical storage nodes is minimized, and therefore the wear of other storage devices is minimized.

The hierarchical storage node can rebuild the data fragments of all the data segments whose storage resiliency is affected or a subset of those data segments. In some embodiments, the hierarchical storage node rebuilds the data fragments for a particular data segment if the current storage resiliency of the data segment is below the minimum storage resiliency to be provided for the data segment, e.g., as described with reference to rebuilding the data fragments in FIGS. 4 and 8.

However, when a particular hierarchical storage node fails or a current storage resiliency of a data segment stored by the particular hierarchical storage node drops below the minimum storage resiliency the storage system 1100 uses the fragments from other hierarchical storage nodes to rebuild the lost fragments. For example, when the hierarchical storage node 314 fails, the front-end subsystem 310 obtains all or some of the remaining segments S2 and S3 from the remaining hierarchical storage nodes, generates a new segment S4 (not illustrated) and transmits it to another hierarchical storage node or one of the hierarchical storage nodes 316 and 318, which further encodes the new segment into fragments and stores them at its associated storage devices.

Figure 12:
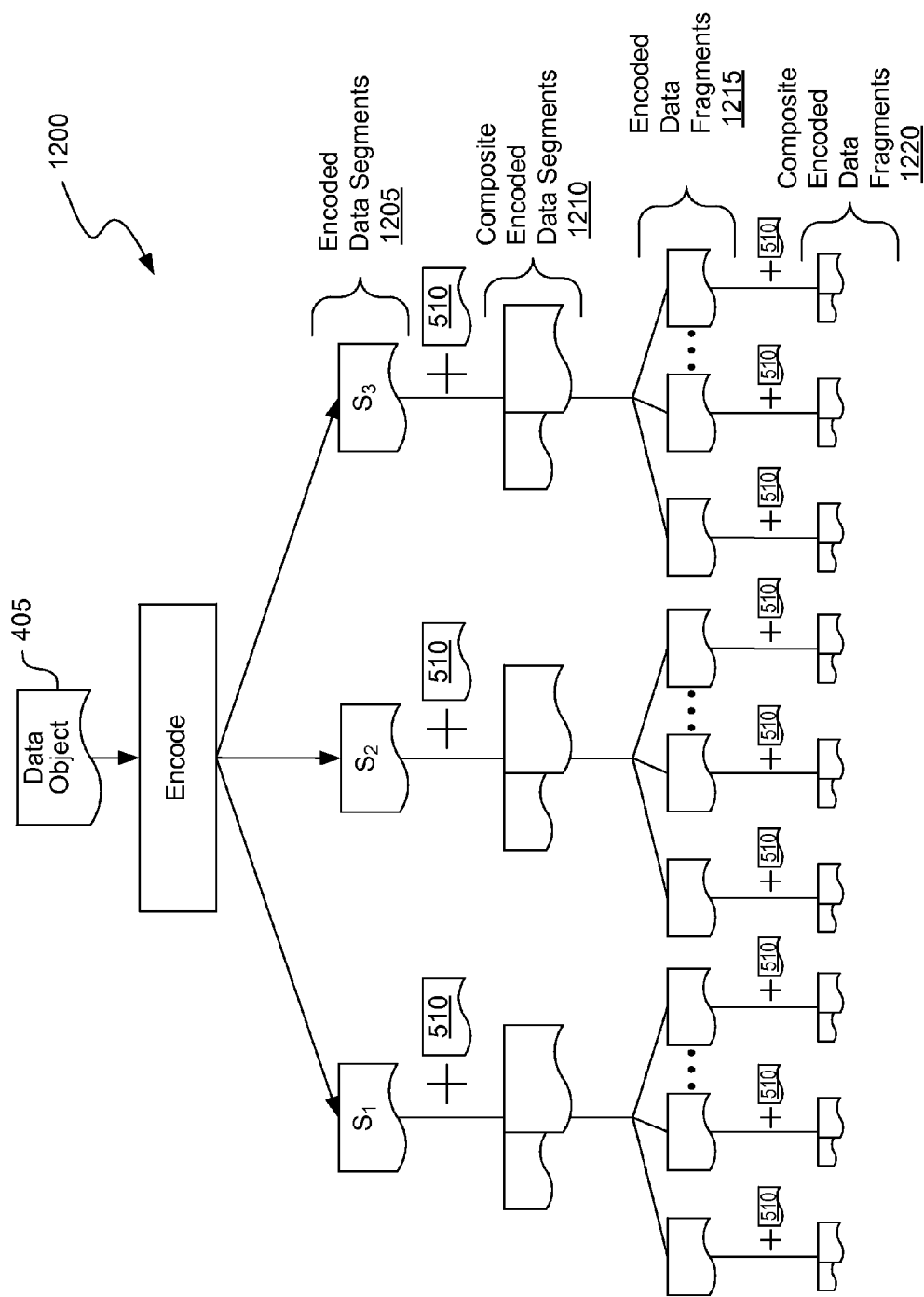
FIG. 12 is a block diagram for storing metadata of a data object with the data object in a storage system of FIG. 11, consistent with various embodiments.

The hierarchical spreading storage architecture can also be used to store metadata of the data received from a client of the storage system 1100. FIG. 12 is a block diagram 1200 for storing metadata of a data object with the data object in a storage system 1100 of FIG. 11, consistent with various embodiments. The hierarchical spreading storage architecture can provide the same storage resiliency to the metadata of a data object that is provided to the data object. Examples of metadata can include, object ID, object size, object owner, creation time, created by, modified by, client-specified metadata, etc. Typically, metadata is stored separate from the data object. The hierarchical spreading storage architecture enables storing the metadata with the data object, thereby eliminating the need to have a separate database for metadata, the need to have specific infrastructure in place to ensure the metadata is consistent with the data, etc.

When a write request is received at the storage system 1100, the payload data in the write request is analyzed to obtain the metadata 510 and the data portion, e.g., data object 405. The data object 405 is then encoded, e.g., using encode/decode module 418, to generate a number of segments 1205, e.g., as described with reference to FIG. 11. The metadata 510 is combined with each of the segments 1205, e.g., concatenated or prefixed to each of the segments 1205, to generate composite segments 1210. In some embodiments, the metadata 510 can be a subset of the metadata of the data object 405. The composite segments 1210 can then be sent to a number of hierarchical storage nodes, e.g., as described with reference to FIG. 11 for further storage at a set of storage devices associated with the hierarchical storage nodes.

When a particular hierarchical storage node receives a composite data segment, it encodes the composite data segment to generate a number of data fragments such as fragments 1215. The metadata 510 is combined with each of the fragments 1215, e.g., concatenated or prefixed to each of the fragments 1215, to generate composite fragments 1220. The composite fragments 1220 can then be stored at the storage devices associated with the hierarchical storage node, e.g., as described with reference to FIG. 11.

Note that though FIG. 12 illustrates combining metadata 510 with both the data segments and the fragments, the metadata 510 can be combined with either the data segments or the data fragments.

In some embodiments, by storing the metadata 510 with the data object 405, the possibility of inconsistency between the metadata 510 and the data object 405 is eliminated. Further, since the metadata 510 is attached to the segments 1205 and/or fragments 1215, the composite segments 1210 can be moved across hierarchical storage nodes and the composite fragments 1220 can be moved across storage devices without having to update the metadata 510 and without risking the consistency between the metadata 510 and the data object 405.

In some embodiments, another benefit of storing the metadata 510 with the data object 405 is that since a separate database and/or metadata server is not needed to maintain the metadata 510, the read and write operations are relatively faster since no separate read/write is required to read/write the metadata 510. In some embodiments, metadata retrieval is also simplified since a method call that is used for retrieving the data object 405 can be modified to use retrieve the metadata 510, which can simplify a number of functions performed related to the metadata 510.

Figure 13:
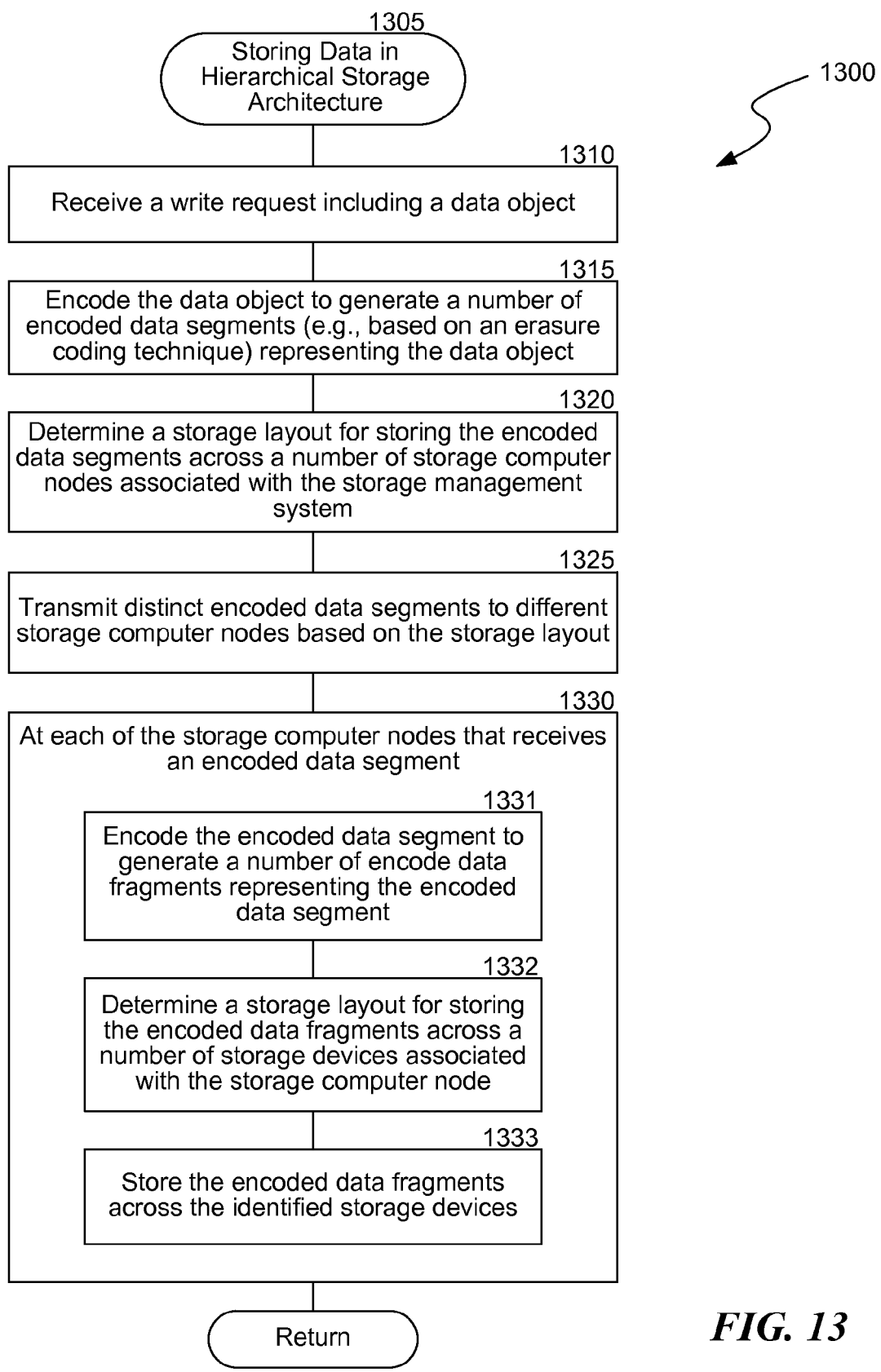
FIG. 13 is a flow diagram of a process of storing data to an object-based storage system using the hierarchical spreading storage architecture, consistent with various embodiments of the disclosed technology.

FIG. 13 is a flow diagram of a process 1300 of storing data to an object-based storage system using hierarchical spreading storage architecture, consistent with various embodiments of the disclosed technology. In some embodiments, the process 1300 may be implemented in environment 300 of FIG. 3, and using the storage system 1100 of FIG. 11. The process 1300 begins at block 1305, and at block 1310, a request module 416 of the frontend subsystem 310 receives a write request including payload data. In some embodiments, the payload data includes data portion and metadata of the data. If the data portion is not in a format suitable for storing in an object storage system, e.g., storage subsystem 306, the frontend subsystem 310 converts the data portion to the suitable format, e.g., as the data object.

At block 1315, the encode/decode module 418 encodes the data object to generate a number of encoded data segments, e.g., encoded data segments S1-S3. In some embodiments, the encode/decode module 418 encodes the data object based on an erasure coding technique. The number of encoded data segments generated can be expressed as a function, e.g., n'=k'+m', where variable k' is the original amount of data segments or the minimum number of data segments required to regenerate or rebuild the data object, and variable m' stands for the extra or redundant segments that are added to provide protection from storage device/storage node failures. The variable n' is the total number of segments created after the encoding process.

After the encoded data segments are generated, a mapping of the object identifier and the segment identifiers of the encoded data segments are stored in the mapping structure 414 in the staging area 408.

In some embodiments, apart from encoding the data object to generate the fragments, various other storage efficiency processes may be performed on the data object, e.g., deduplication, compression, encryption. One or more of these processes can be performed by the storage processing module 430.

At block 1320, the storage layout module 420 determines a storage layout for sending the encoded data segments across a number of hierarchical storage nodes, e.g., hierarchical storage nodes 314-318. In some embodiments, the storage layout module 420 is configured to spread the encoded data segments across as many hierarchical storage nodes as possible, e.g., to provide better storage resiliency to the data object. That is, the storage layout module 420 attempts to identify different hierarchical storage nodes for storing different encoded data segments. In some embodiments, the storage layout module 420 selects the hierarchical storage nodes on a random basis. In some embodiments, the storage layout module 420 selects the hierarchical storage nodes on a random weighted basis. In some embodiments, the random weighted basis attempts to store the data segments evenly across the hierarchical storage nodes. For example, one type of weighting is to decrease the weight if there are already a specified number of segments stored at the hierarchical storage node. In some embodiments, the random weighted basis randomly identifies the hierarchical storage nodes at which the encoded data segments are to be stored as a function of decreasing the risk of data loss. For example, if a particular geographical region is prone to higher number of device failures, then the storage nodes in that geographical region may be weighted less so that a lower number of segments are written to the storage nodes in that geographical region.

At block 1325, the transceiver module 432 transmits the encoded data segments to the identified hierarchical storage nodes. For example, the transceiver module 432 can transmit the encoded data segments S1-S3 to hierarchical storage nodes 314-318, respectively.

At block 1330, each of the hierarchical storage that receives an encoded data segment, processes the encoded data segment to store it at a set of storage devices associated with the hierarchical storage node, and the process 1300 returns. The processing can include encoding the data segment to generate a number of data fragments (block 1331). For example, the hierarchical storage node 314 encodes the data segment to generate fragments F1-F8. In some embodiments, the hierarchical storage node encodes the data segment based on an erasure coding technique. Also, the erasure coding technique used to generate the data segments can be different from that used for generating the fragments from the segment.

The hierarchical storage node includes a storage layout module, e.g., similar to the storage layout module 420, that determines a storage layout for storing the data fragments at a set of storage devices associated with the hierarchical storage node (block 1332). In some embodiments, the storage layout module is configured to spread the encoded data fragments across as many storage devices as possible, e.g., to provide better storage resiliency to the data object. After the storage layout is determined, the hierarchical storage node stores the encoded data fragments at the identified storage devices (block 1333).

In some embodiments, the front-end subsystem 310 also stores the metadata of the data object with the data segments and/or fragments. Additional details with respect to the process of storing the metadata is described at least with reference to FIGS. 9 and 17.

Figure 14:
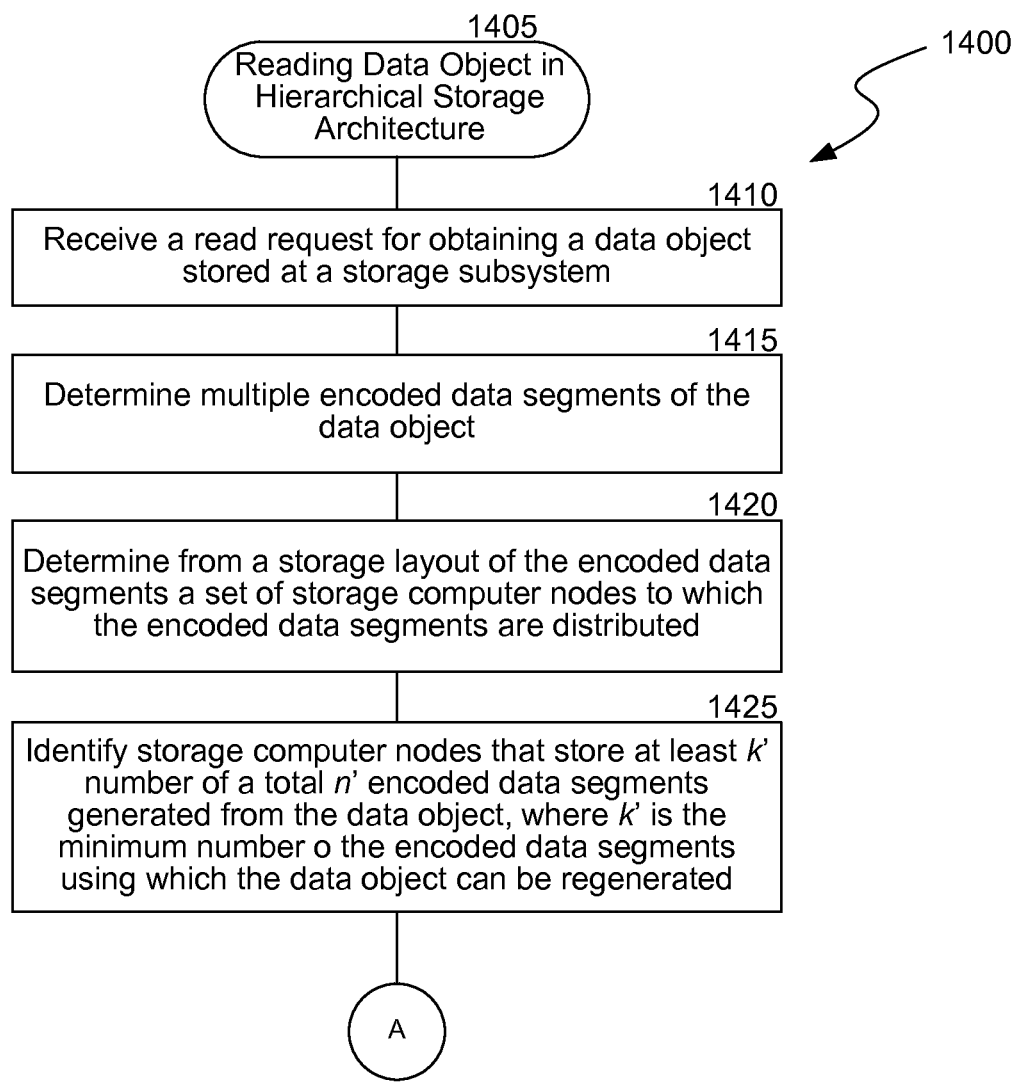
FIG. 14 is a flow diagram of a process of reading data from an object-based storage system using the hierarchical spreading storage architecture, consistent with various embodiments of the disclosed technology.
Figure 14:
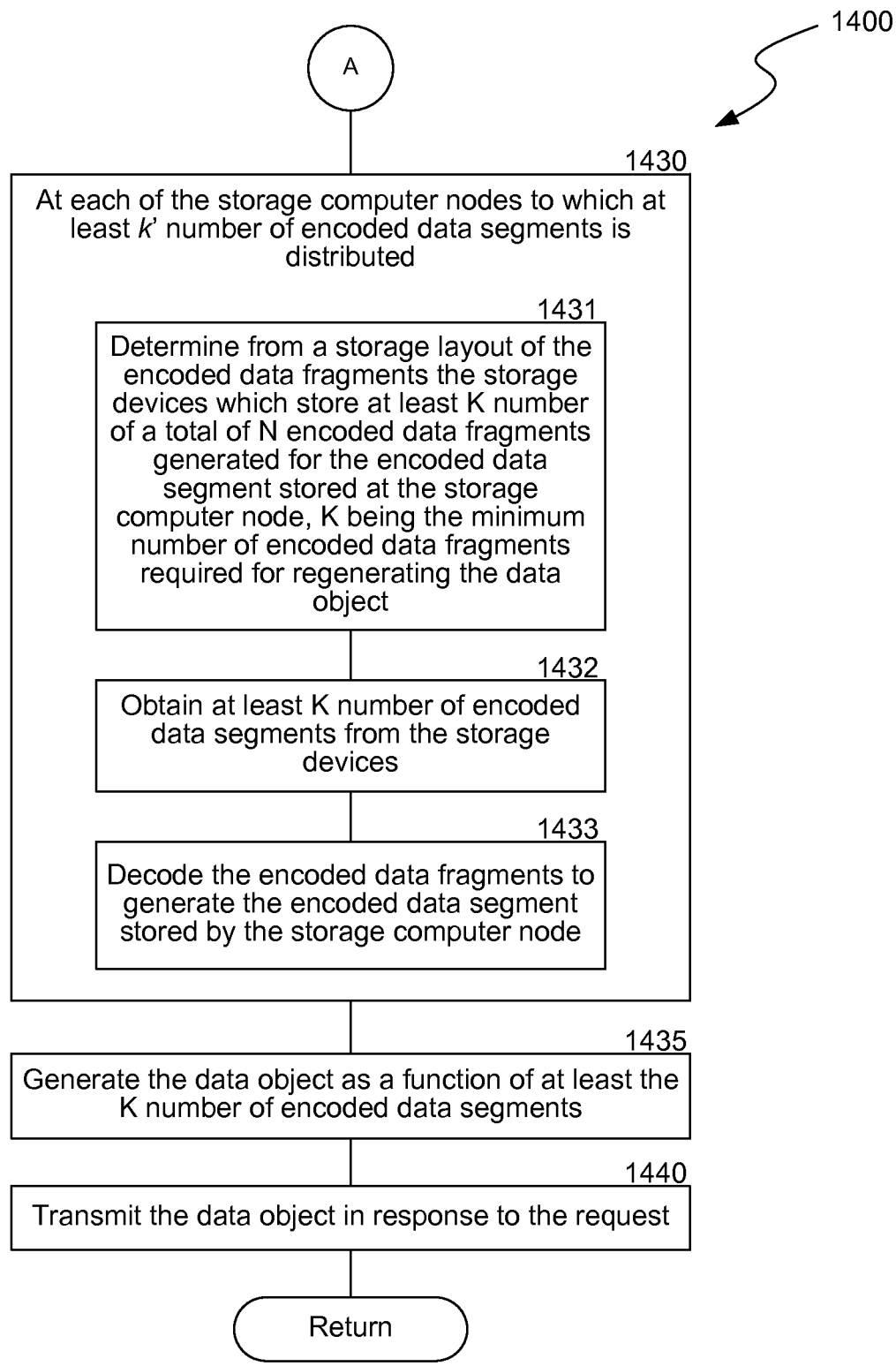

FIG. 14 is a flow diagram of a process 1400 of reading data from an object-based storage system using hierarchical spreading storage architecture, consistent with various embodiments of the disclosed technology. In some embodiments, the process 1400 may be implemented in environment 300 of FIG. 3, and using the storage system 1100 of FIG. 11. The process 1400 begins at block 1405, and at block 1410, a request module 416 of the frontend subsystem 310 receives a read request, e.g., from a client system 312a, for obtaining a data object. In some embodiments, the read request includes an object identifier of the data object.

At block 1415, the fragment/segment identification module 422, determines the encoded data segments of the data object using the object identifier. In some embodiments, a mapping of the object identifier and the encoded data segments are stored in the mapping structure 414 in the staging area 408.

At block 1420, the storage layout module 420 determines the storage layout of the encoded data segments using the mapping obtained from the mapping structure 414. The storage layout can include identification information of the hierarchical storage nodes where each of the encoded data segments are stored.

At block 1425, the transceiver module 432 identifies the hierarchical storage nodes that store sufficient number of the encoded data segments required to generate the data object. In some embodiments, the sufficient number of encoded data segments is k' number of the encoded data segments. In some embodiments, the transceiver module 432 can obtain k' to n' number of segments. For example, the transceiver module 432 can stop fetching the segments after obtaining the first k' segments. In another example, the transceiver module 432 can fetch all the n' segments but use only the first k' segments for regenerating the data object.

Further, the transceiver module 432 can preferentially select a subset of the identified hierarchical storage nodes to obtain the segments from. The transceiver module 432 can select a hierarchical storage node based on a number of factors, e.g., a read latency of the hierarchical storage node, type of the storage devices associated with hierarchical storage node, number of pending read requests ahead of the current read request in a read request queue of the hierarchical storage node, a geographical location of the hierarchical storage node.

After the hierarchical storage nodes are identified, the transceiver module 432 requests each of the hierarchical storage nodes for the data segment.

At block 1430, each of the identified hierarchical storage nodes performs a number of steps, e.g., 1431-1433, to obtain the data segment. At block 1431, the hierarchical storage node determines from a storage layout of the fragments, the set of storage devices that store sufficient number of the encoded data fragments required to generate the data segment. In some embodiments, the sufficient number of encoded data fragments is k number of the encoded data fragments. In some embodiments, the hierarchical storage node can obtain k to n number of fragments. For example, the hierarchical storage node can stop fetching the fragments after obtaining the first k fragments. In another example, the hierarchical storage node can fetch all the n fragments but use only the first k fragments for regenerating the data segment.

Further, the hierarchical storage node can preferentially select a subset of the identified storage devices to obtain the fragments from. The hierarchical storage node can select a storage device based on a number of factors, e.g., a read latency of the storage device, a type of the storage device, number of pending read requests ahead of the current read request in a read request queue of the storage device, a geographical location of the storage device. At block 1432, the hierarchical storage node obtains the sufficient number of fragments from the identified set of storage devices.

At block 1433, after obtaining the encoded data fragments, the hierarchical storage node decodes the encoded data fragments, e.g., based on the erasure coding method used to encode the data segment, to generate the data segment. After generating the data segment, the hierarchical storage node returns the data segment to the front-end subsystem 310. In some embodiments, additional processes may be performed before decoding the data fragments. For example, the hierarchical storage node can decrypt the encoded data fragments if they were encrypted before being stored. In some embodiments, additional processes may be performed on the decoded data segment before the data segment is returned to the front-end subsystem 310. For example, the hierarchical storage node can perform decompression and dededuplication on the decoded data segment if the data segment was deduplicated and compressed.

After obtaining sufficient number of the encoded data segments, at block 1435, the encode/decode module 418 of the front-end subsystem 310 decodes the encoded data segments, e.g., based on the erasure coding method used to encode the data object, to generate the data object.

At block 1440, the transceiver module 432 transmits the data object in response to the read request, e.g., to the client system 312a, and the process 1400 returns. In some embodiments, additional processes may be performed before decoding the data segments. For example, the storage processing module 430 can decrypt the encoded data segments if they were encrypted before being stored. In some embodiments, additional processes may be performed on the decoded data object before it is returned to the client 312a. For example, the storage processing module 430 can perform decompression and de-deduplication on the decoded data object if the data object was deduplicated and compressed.

Figure 15:
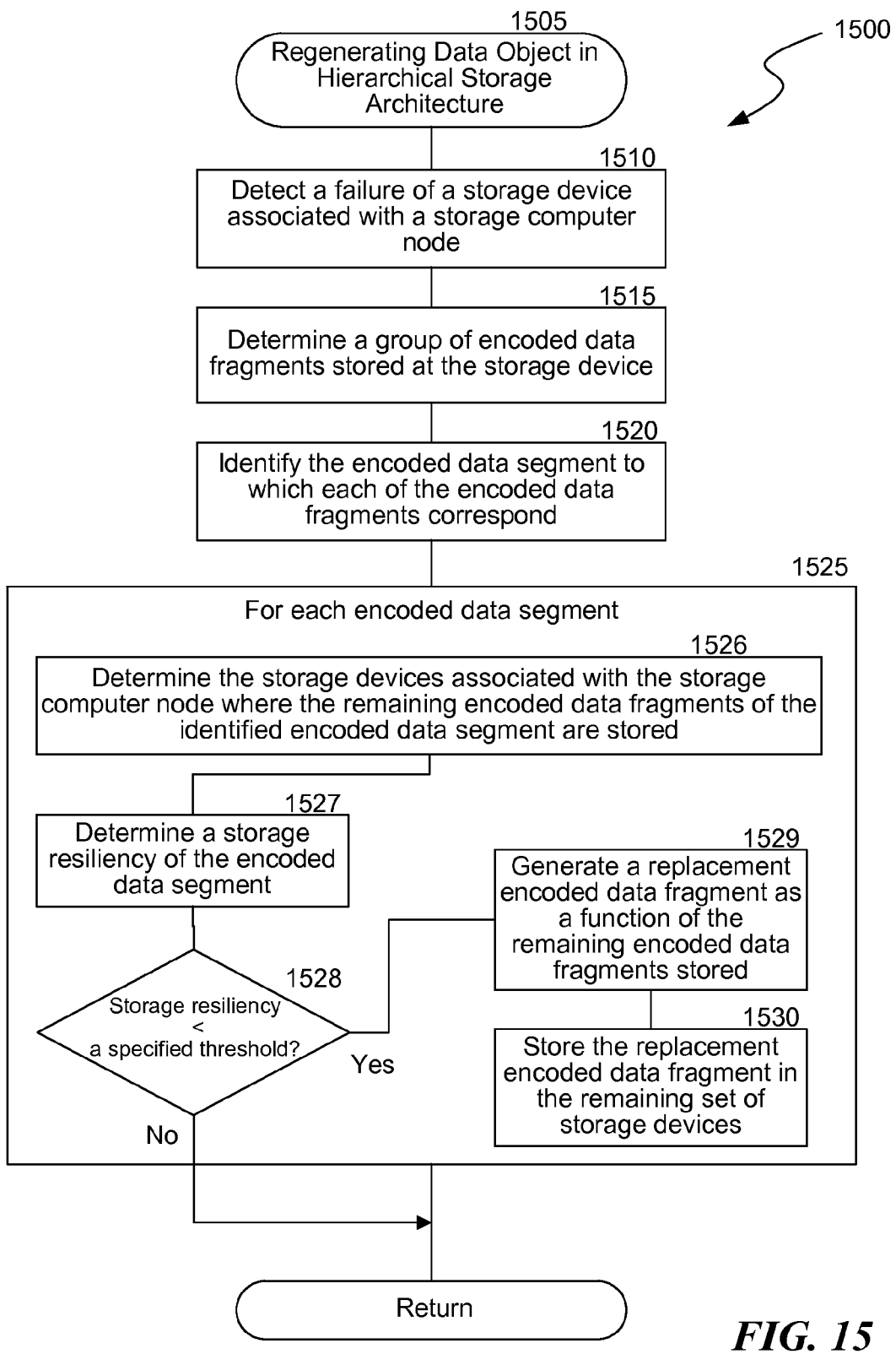
FIG. 15 is a flow diagram of a process of rebuilding data fragments of a data object in the hierarchical spreading storage architecture, consistent with various embodiments of the disclosed technology.

FIG. 15 is a flow diagram of a process 1500 of rebuilding data fragments of a data object in hierarchical spreading storage architecture, consistent with various embodiments of the disclosed technology. In some embodiments, the process 1500 may be implemented in environment 300 of FIG. 3, and using the storage system 1100 of FIG. 11. In some embodiments, the data fragments stored in the storage subsystem 306 may be lost due to a failure of a storage device. The process 1500 begins at block 1505, and at block 1510, a hierarchical storage node detects a failure of a storage device, e.g., storage device 304, associated with the hierarchical storage node. In some embodiments, the failure can be one or more of the storage device being not accessible, the storage device being physically damaged, the storage device determined to fail in a specified period, the storage device determined to fail in a specified number of read/write operations, etc.

At block 1515, the hierarchical storage node identifies the encoded data fragments that were stored at the storage device. For example, the hierarchical storage node can refer to the storage layout to determine the fragments stored at the storage device that has failed.

At block 1520, the hierarchical storage node identifies the one or more data segments corresponding to the identified encoded data fragments. For example, the hierarchical storage node can refer to the mapping structure to determine the data segments associated with the identified encoded data fragments.

At block 1525, the hierarchical storage node rebuilds some or all of the encoded data fragments that was stored at the storage device that failed. In some embodiments, rebuilding the data fragments include performing the method described in association with blocks 1526-1530 for each of the identified data segments.

At block 1526, the hierarchical storage node identifies the storage devices where the data fragments of the identified data segment are stored. The hierarchical storage node may use the storage layout determined by the storage layout module of the node to identify the storage devices that store the data fragments of the data segment. At block 1527, the hierarchical storage node computes the current storage resiliency of the data segment. In some embodiments, storage resiliency is defined as a resistance to loss of one or more storage devices storing a portion of a data segment or resistance to loss of one or more fragments of the data segment. In some embodiments, a current storage resiliency of a data segment is determined as a function of the number of fragments remaining out of n fragments and k. For example, if n is "10," k is "8," the number of redundant fragments, m is "2," and therefore, the storage resiliency can be calculated as 25% (m/k*100). Note that the storage resiliency can be calculated using other functions and based on several other parameters. The storage system 1100 may guarantee a storage resiliency range to the clients of the storage system, for example, a minimum storage resiliency and a maximum storage resiliency. In some embodiments, the storage resiliency range is part of the SLO guaranteed to the clients. In some embodiments, the storage system 1100 may not rebuild the lost data fragments until the current storage resiliency of the data segment is or below the minimum storage resiliency.

At determination block 1528, the hierarchical storage node determines if the current storage resiliency of the data segment is less than the minimum storage resiliency. Responsive to a determination that the current storage resiliency of the data segment is not less than the minimum storage resiliency, the process 1500 returns. On the other hand, responsive to a determination that the current storage resiliency is less than the minimum storage resiliency, at block 1529, the hierarchical storage node obtains sufficient number of fragments of the data segment stored at the identified storage devices (e.g., identified in block 1526). In some embodiments, the hierarchical storage node can obtain the minimum number of fragments required to rebuild the data fragments.

At block 1529, the hierarchical storage node generates the replacement data fragments as a function of the obtained data fragments, and at block 1530, the hierarchical storage node stores the regenerated data fragments in at least a subset of the remaining storage devices. In some embodiments, the hierarchical storage node regenerates as many data fragments as required to meet a specified storage resiliency, which can be up to maximum storage resiliency. In some embodiments, regenerating the data fragments as a function of the obtained data fragments includes decoding the obtained data fragments to generate the data segment and encoding the generated data segment to generate the specified number of data fragments. In some embodiments, the hierarchical spreading storage performs the encoding and decoding using an erasure coding method.

Figure 16:
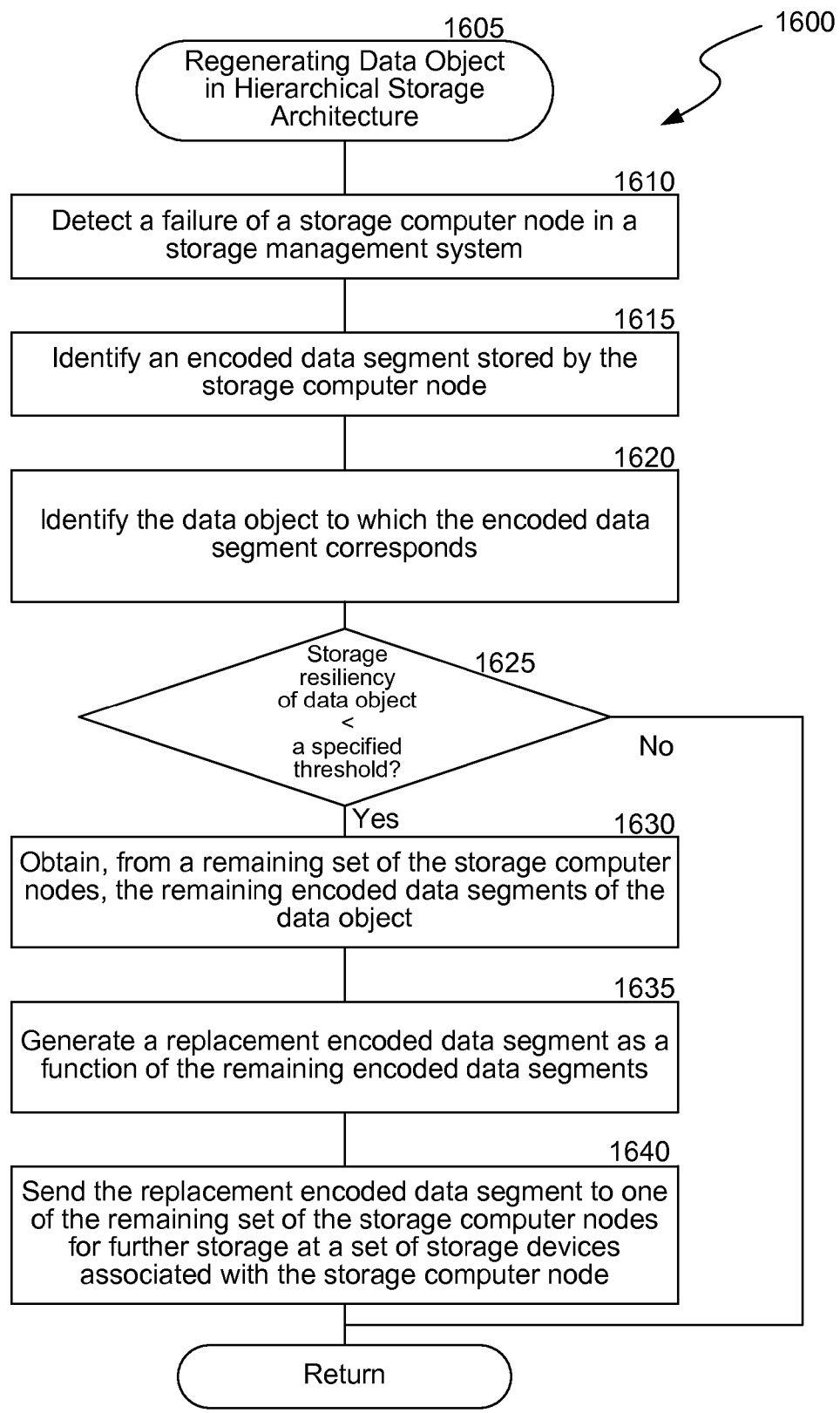
FIG. 16 is a flow diagram of a process of rebuilding data segments of a data object in the hierarchical spreading storage architecture, consistent with various embodiments of the disclosed technology.

FIG. 16 is a flow diagram of a process 1600 of rebuilding data segments of a data object in hierarchical spreading storage architecture, consistent with various embodiments of the disclosed technology. In some embodiments, the process 1600 may be implemented in environment 300 of FIG. 3, and using the storage system 1100 of FIG. 11. In some embodiments, the data segments stored by a hierarchical storage node may be lost due to a failure of a storage device and/or a hierarchical storage node. The process 1600 begins at block 1605, and at block 1610, a failure detection module 424 of front-end subsystem 310 detects a failure of a hierarchical storage node and/or a failure of one or more storage devices of the hierarchical storage node that caused the storage resiliency of a particular data segment to drop. In some embodiments, the failure can be one or more of the storage device being not accessible, the storage device being physical damaged, the hierarchical storage node not being accessible, the storage device determined to fail in a specified period, the storage device determined to fail in a specified number of read/write operations, etc.

At block 1615, the fragment/segment identification module 422 identifies the encoded data segment stored by the hierarchical storage device. For example, the fragment/segment identification module 422 can refer to the storage layout to determine the segments stored at the particular hierarchical storage node that has failed.

At block 1620, the fragment/segment identification module 422 identifies the data object to which the encoded data segment corresponds. For example, the fragment/segment identification module 422 can refer to the mapping structure to determine the data segments associated with the identified data object.

At determination block 1625, the regeneration module 428 computes the current storage resiliency of the data object and determines if the storage resiliency of the object is below the specified minimum storage resiliency. In some embodiments, a current storage resiliency of a data object is determined as a function of the number of segments remaining out of n' segments and k'. For example, if n' is "10," k' is "8," the number of redundant segments, m' is 2, and therefore, the storage resiliency can be calculated as 25% (m/k*100). Note that the storage resiliency can be calculated using other functions and based on several other parameters. In some embodiments, the storage system 1100 may not rebuild the lost data segments until the current storage resiliency of the data object is or below the minimum storage resiliency.

Responsive to a determination that the current storage resiliency of the data object is not less than the minimum storage resiliency, the process 1600 returns. On the other hand, responsive to a determination that the current storage resiliency is less than the minimum storage resiliency, at block 1630, the transceiver module 432 obtains sufficient number of segments of the data object stored at other hierarchical storage nodes. In some embodiments, the transceiver module 432 obtains the segments of the data object stored at other hierarchical storage nodes as described with at least with reference to blocks 1425-1433 of FIG. 14.

At block 1635, the regeneration module 428 generates the replacement data segment as a function of the obtained data segments. In some embodiments, the regeneration module 428 generates as many data segments as required to meet a specified storage resiliency for the data object, which can be up to a specified maximum storage resiliency of the data object. In some embodiments, regenerating the data segments as a function of the obtained data segments includes decoding the obtained data segments to generate the data object and encoding the generated data object to generate the specified number of data segments. In some embodiments, the hierarchical spreading storage performs the encoding and decoding using an erasure coding method.

At block 1640, the transceiver module 432 sends the regenerated data segments to one or more of the remaining storage devices for storage at their associated storage devices. In some embodiments, the transceiver module 432 transmits the replacement data segments of the data object to other hierarchical storage nodes as described with at least with reference to blocks 1320-1333 of FIG. 13.

In various embodiments, if an insufficient number of data fragments are found in the storage subsystem 360, additional fragments may be retrieved from latent storage 450, e.g., sufficient to regenerate the data. If a sufficient number of data fragments are found in the storage subsystem 360, additional fragments may be retrieved from latent storage 450 to proactively replace lost fragments.

Figure 17:
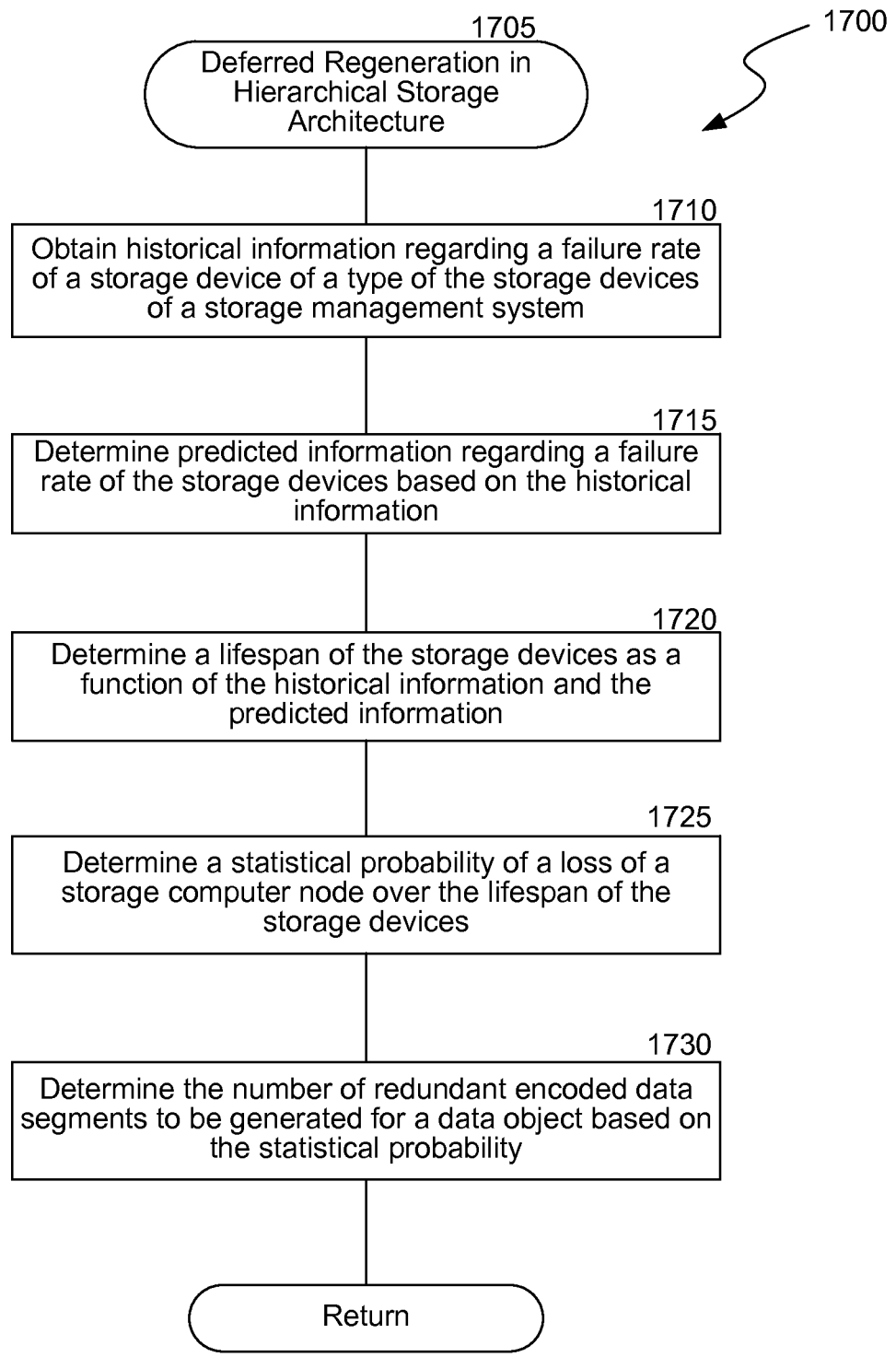
FIG. 17 is a flow diagram of a process of deferred rebuilding of data segments of a data object in the hierarchical spreading storage architecture, consistent with various embodiments of the disclosed technology.

FIG. 17 is a flow diagram of a process 1700 of deferred rebuilding of data segments of a data object in the hierarchical spreading storage architecture, consistent with various embodiments of the disclosed technology. In some embodiments, the process 1700 may be implemented in environment 300 of FIG. 3, and using the storage system 1100 of FIG. 11. The rebuilding/regeneration process 1600 can consume significant system resources for regenerating the encoded data segments, e.g., network resources for reading at least k' number of encoded data segments from other hierarchical storage nodes, computing resources of the corresponding hierarchical storage nodes in obtaining the fragments of the corresponding data segment and decoding them to generate the encoded data segment, etc. In some embodiments, the consumption of the system resources can be minimized by postponing or deferring the regeneration process 1600 until a later time, e.g., when the storage devices are replaced with new storage devices, when the data in the storage devices is migrated, etc.

In some embodiments, the generation of replacement data segments for the lost data segments is deferred until after one or more of the failed storage devices and/or one or more of the hierarchical storage nodes is replaced. That is, the regeneration process may not be executed during the lifetime of the storage devices and/or the hierarchical storage nodes. In some embodiments, the timing of the regeneration process is controlled based on m', the number of redundant encoded data segments to be generated. As described above at least with reference to the regeneration process 1600, the regeneration process 1600 is triggered when the current storage resiliency of the data object drops below the minimum storage resiliency. The storage resiliency of a data object is a function of the total number of encoded data segments, n', stored across the hierarchical storage nodes, which is a function of m'. The m' can be determined such that the storage resiliency of the data object does not drop below the minimum storage resiliency during the lifespan of one or more of the storage devices. In other words, the number of encoded data segments generated are such that a loss of a subset of the encoded data segments does not drop the storage resiliency of the data object below the minimum storage resiliency during the lifespan of one or more of the storage devices. The following paragraphs describe the process 1700 in further detail.

The process 1700 begins at block 1705, and at block 1710, the regeneration module 428 obtains the historical information regarding a failure rate of storage devices of the type of the storage devices in the environment 300. The historical information can include a number of parameters that can describe and/or help determine the failure information of a storage device, e.g., an annual failure rate (AFR) of the storage device of a particular type, an AFR of the storage device based on a particular workload on the storage device, how long a storage device is expected to survive based on a particular workload. Such historical information can be gathered from various sources, gathered from the environment 300 over a period and/or can be input by a user such as an administrator of the environment 300.

At block 1715, the regeneration module 428 predicts the failure rate of the storage devices in the environment 300 and generates the predicted information. The regeneration module 428 can interpolate the historical information with various parameters of the storage devices in the environment 300, e.g., the number of storage devices in the environment 300, a workload of the storage devices, the number of read/write operations performed on the storage devices, a remaining life of the storage devices, and determine the predicted failure rate of the storage devices.

At block 1720, the regeneration module 428 determines the lifespan of the storage devices as a function of the historical information and the predicted information. At block 1725, the regeneration module 428 determines a statistical probability of a loss of a failure of one or more hierarchical storage nodes based on the determined lifespan of the storage devices. In some embodiments, a failure/loss of a hierarchical storage node is a function of the lifespan of the set of storage devices associated with the hierarchical storage node since a failure of one or more storage devices from the set can result in a failure of the hierarchical storage node. Further, a failure of the hierarchical storage node can result in a loss of the encoded data segment stored at the hierarchical storage node.

At block 1730, the regeneration module 428 determines the redundant number of encoded data segments, m', to be generated for the data object based on the statistical probability of the loss of the hierarchical storage node. The regeneration module 428 notifies the encode/decode module 418 regarding the determined m', and the encode/decode module 418 encodes the data object to generate the encoded data segments accordingly.

In some embodiments, the regeneration module 428 may continuously adjust m', e.g., based on a specified schedule or certain events such as when storage devices are added or removed, to factor in any change in the parameters of the environment 300, e.g., change in workload on the storage devices, addition or removal or storage devices, etc.

Note that although the process 1700 is described as being performed by the regeneration module 428, the process 1700 can be performed by a combination of modules of the front-end subsystem 310 and/or sub-modules of the regeneration module 428 (not illustrated).

In various embodiments, if an insufficient number of data fragments are found in the storage subsystem 360, additional fragments may be retrieved from latent storage 450, e.g., sufficient to regenerate the data. If a sufficient number of data fragments are found in the storage subsystem 360, additional fragments may be retrieved from latent storage 450 to proactively replace lost fragments.

Figure 18:
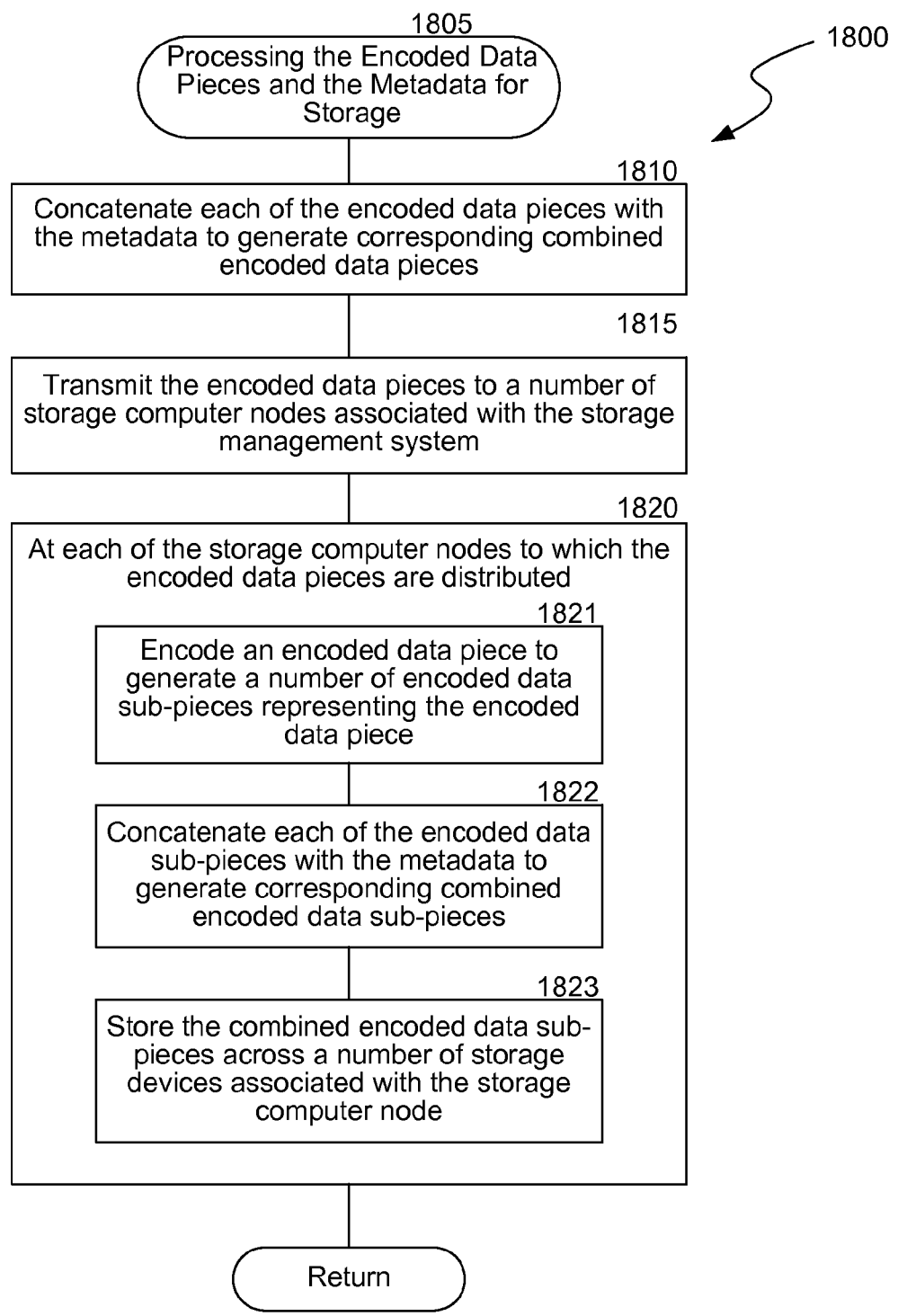
FIG. 18 is a flow diagram of a process of processing metadata and data fragments of a data object in the hierarchical spreading storage architecture, consistent with various embodiments of the disclosed technology.

FIG. 18 is a flow diagram of a process 1800 of processing metadata and data fragments of a data object in hierarchical spreading storage architecture, consistent with various embodiments of the disclosed technology. In some embodiments, the process 1800 may be implemented in environment 300 of FIG. 3, and using the storage system 1100 of FIG. 11. In some embodiments, the process 1800 is an implementation of the method of block 925 of FIG. 9. The data piece generated in the process 900 of FIG. 9, e.g., in block 920, can be considered as a data segment in the hierarchical spreading storage architecture. The process 1800 begins at block 1805, and at block 1810, the metadata processing module 426 combines the metadata of a data object, e.g., metadata 510, with each of the segments, e.g., segments 1205, to generate composite segments, e.g., composite segments 1210. In some embodiments, combining the metadata with data segment can include concatenating the metadata with segment or prefixing a segment with the metadata. In some embodiments, the metadata 510 combined with segment can be a subset of the metadata of the data object 405.

After the composite segments are generated, at block 1815, the transceiver module 432 transmits the composite segments to a number of hierarchical storage nodes, e.g., as described at least with reference to blocks 1320 and 1325 of FIG. 13 for further storage at a set of storage devices associated with the hierarchical storage nodes.

At block 1820, when a particular hierarchical storage node receives a composite data segment, it encodes the composite data segment to generate a number of data fragments, e.g., fragments 1215 (block 1821). In some embodiments, the composite data segment is encoded to generate a number of data fragments as described at least with reference to block 1331 of FIG. 13.

At block 1822, the particular hierarchical storage node combines each of the fragments with the metadata, e.g., concatenates or prefixes the fragments 1215 with the metadata 510, to generate the composite fragments, e.g., composite fragments 1220.

After the composite fragments are generated, at block 1823, the particular hierarchical storage node stores the composite fragments at a set of storage devices associated with the hierarchical storage node, e.g., as described with reference to blocks 1332 and 1333 of FIG. 13.

Note that although FIG. 18 illustrates combining metadata 510 with both the data segments and the fragments, the metadata 510 can be combined with either the data segments or the data fragments.

Figure 19:
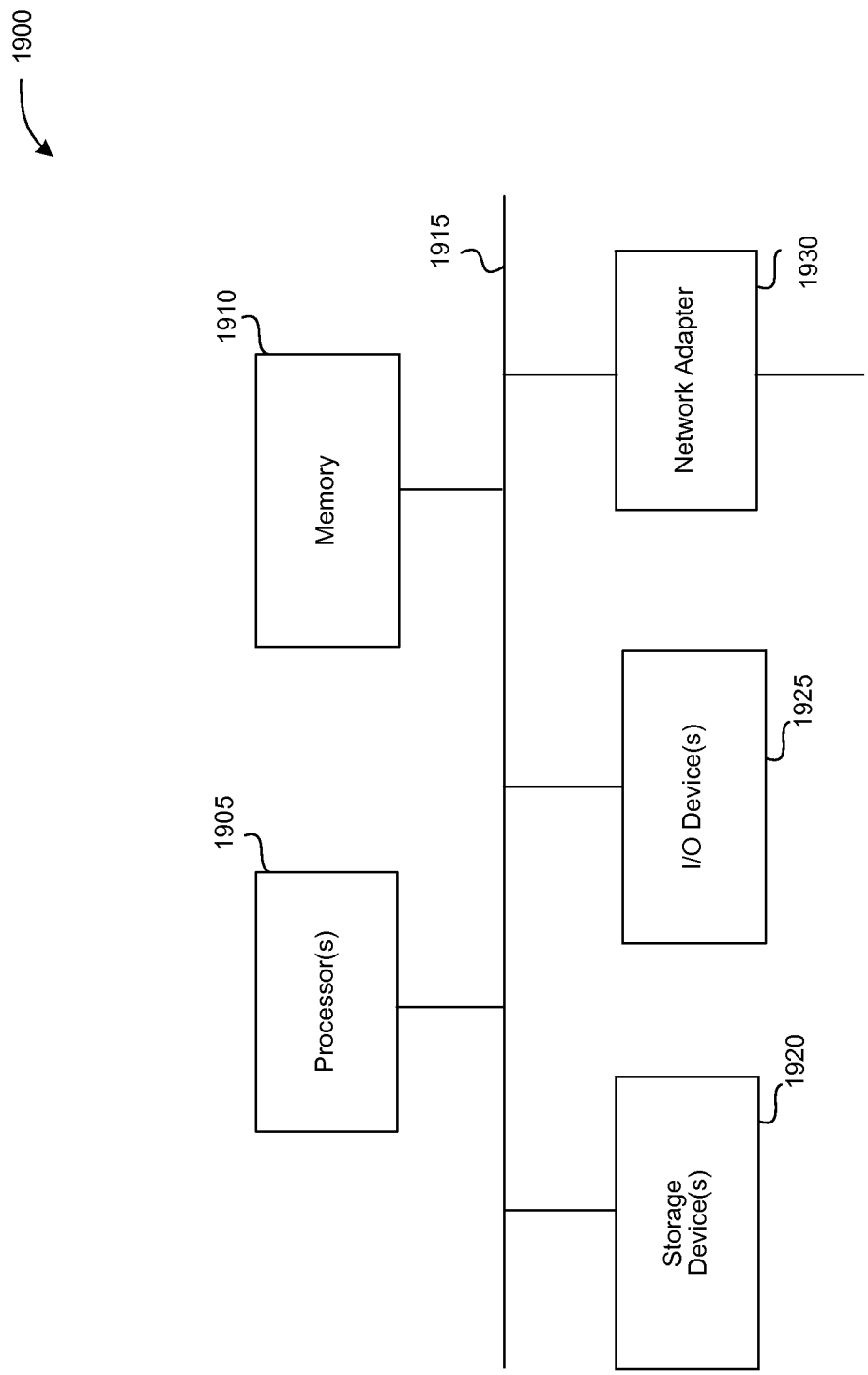
FIG. 19 is a block diagram of a computer system as may be used to implement features of some embodiments of the disclosed technology.

FIG. 19 is a block diagram of a computer system as may be used to implement features of some embodiments of the disclosed technology. The computing system 1900 may be used to implement any of the entities, components or services depicted in the examples of FIGS. 1-17 (and any other components described in this specification). The computing system 1900 may include one or more central processing units ("processors") 1905, memory 1910, input/output devices 1925 (e.g., keyboard and pointing devices, display devices), storage devices 1920 (e.g., disk drives), and network adapters 1930 (e.g., network interfaces) that are connected to an interconnect 1915. The interconnect 1915 is illustrated as an abstraction that represents any one or more separate physical buses, point to point connections, or both connected by appropriate bridges, adapters, or controllers. The interconnect 1915, therefore, may include, for example, a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus, also called "Firewire".

The memory 1910 and storage devices 1920 are computer-readable storage media that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection. Thus, computer readable media can include computer-readable storage media (e.g., "non-transitory" media) and computer-readable transmission media.

The instructions stored in memory 1910 can be implemented as software and/or firmware to program the processor(s) 1905 to carry out actions described above. In some embodiments, such software or firmware may be initially provided to the computing system 1900 by downloading it from a remote system through the computing system 1900 (e.g., via network adapter 1930).

The technology introduced herein can be implemented by, for example, programmable circuitry (e.g., one or more microprocessors) programmed with software and/or firmware, or entirely in special-purpose hardwired (non-programmable) circuitry, or in a combination of such forms. Special-purpose hardwired circuitry may be in the form of, for example, one or more ASICs, PLDs, FPGAs, etc.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Some terms that are used to describe the disclosure are discussed below, or elsewhere in the specification, to provide additional guidance to the practitioner regarding the description of the disclosure. For convenience, some terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. One will recognize that "memory" is one form of a "storage" and that the terms may on occasion be used interchangeably.

Consequently, alternative language and synonyms may be used for any one or more of the terms discussed herein, nor is any special significance to be placed upon whether or not a term is elaborated or discussed herein. Synonyms for some terms are provided. A recital of one or more synonyms does not exclude the use of other synonyms. The use of examples anywhere in this specification including examples of any term discussed herein is illustrative only, and is not intended to further limit the scope and meaning of the disclosure or of any exemplified term. Likewise, the disclosure is not limited to various embodiments given in this specification.

Those skilled in the art will appreciate that the logic illustrated in each of the flow diagrams discussed above, may be altered in various ways. For example, the order of the logic may be rearranged, substeps may be performed in parallel, illustrated logic may be omitted; other logic may be included, etc.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

I claim:

1. A method comprising:
a front-end subsystem erasure coding an object into n fragments based on a storage resiliency value defined by a service level objective;
determining that a first plurality of the n fragments will be stored in a first storage tier, wherein a number of the first plurality of the n fragments is equal to or greater than k, wherein k is a minimum number of fragments sufficient to reconstruct the object;
determining that a second plurality of the n fragments will be stored in a second storage tier, wherein the second storage tier comprises latent storage, wherein the second plurality of the n fragments consists of protection fragments; and
updating storage layout information to indicate locations of the fragments in the first and the second storage tiers.

2. The method of claim 1, further comprising:
in response to an attempt to reconstruct the object, determining that available ones of the first plurality of the n fragments are insufficient to reconstruct the object; and
retrieving a sufficient number of the second plurality of the n fragments from the second storage tier to reconstruct the object with available ones of the first plurality of the n fragments from the first storage tier, wherein the sufficient number is according to the erasure coding.

3. The method of claim 2, further comprising:
generating additional protection fragments to replenish the sufficient number of the second plurality of fragments used to reconstruct the object; and
transmitting the additional protection fragments for storing in the second storage tier.

4. The method of claim 1, wherein the second storage tier is at least one of lower cost storage than the first storage tier and accessed via a lower throughput data access than the first storage tier.

5. The method of claim 1, wherein a number of the second plurality of fragments is based on an estimated number of failures in the first storage tier between hardware refreshes of the first storage tier.

6. The method of claim 1 further comprising proactively replacing lost fragments of the first plurality of the n fragments using the second plurality of the n fragments although remaining ones of the first plurality of n fragments are sufficient to reconstruct the object.

7. The method of claim 1, wherein n is greater than several hundred and the first plurality of n fragments includes redundant fragments of the object.

8. A storage system comprising:
a processor;
a plurality of storage interfaces; and
a computer-readable medium comprising instructions executable by the processor to cause the storage system to,
erasure code an object into n fragments that satisfies a storage resiliency value defined by a service level objective;
determine that a first plurality of the n fragments will be stored in a first storage tier, wherein a number of the first plurality of the n fragments is equal to or greater than k, wherein k is a minimum number of fragments sufficient to reconstruct the object;
determine that a second plurality of the n fragments will be stored in a second storage tier, wherein the second storage tier is latent storage, wherein the second plurality of the fragments consists of protection fragments; and
update storage layout information to indicate location of the fragments in the first and the second storage tiers.

9. The storage system of claim 8, wherein the computer-readable medium further comprises instructions to:
determine that available ones of the first plurality of the n fragments are not sufficient to reconstruct the object; and
retrieve a sufficient number of the second plurality of the n fragments from the second storage tier to reconstruct the object with available ones of the first plurality of the n fragments from the first storage tier, wherein the sufficient number is according to the erasure coding.

10. The storage system of claim 9, wherein the computer-readable medium further comprises instructions to:
generate additional protection fragments to replenish the sufficient number of the second plurality of fragments used to reconstruct the object; and
transmit, via a first set of the plurality of storage interfaces of a secondary data access path, the additional protection fragments for storing in the second storage tier, wherein a second set of the plurality of storage interfaces corresponds to a primary data access path of the first storage tier.

11. The storage system of claim 8, wherein a primary data access path to the first storage tier comprises a first set of the plurality of storage interfaces and a secondary data access path to the second storage tier comprises a second set of the plurality of storage interfaces.

12. The storage system of claim 8, wherein a number of the second plurality of the n fragments is based on an estimated number of failures in the first storage tier between hardware refreshes of the first storage tier.

13. The storage system of claim 8, wherein the instructions further comprise instructions executable by the processor to cause the storage system to proactively replace lost fragments of the first plurality of the n fragments using the second plurality of the n fragments although remaining ones of the first plurality of n fragments are sufficient to reconstruct the object.

14. The storage system of claim 8, wherein n is greater than several hundred and the first plurality of n fragments includes redundant fragments of the object.

15. The storage system of claim 8, wherein the instructions to determine that the second plurality of the n fragments will be stored in the second storage tier comprises the instructions executable by the processor to cause the storage system to select the second storage tier for the second plurality of the n fragments based on the second storage tier comprising latent storage.

16. A non-transitory computer-readable medium comprising instructions for storing protection fragments of erasure coded objects in latent storage, the instructions to:
  erasure code an object into n fragments based on a storage resiliency value defined by a service level objective;
  determine that a first plurality of the n fragments will be stored in a first storage tier, wherein a number of the first plurality of the n fragments is equal to or greater than k, wherein k is a minimum number of fragments sufficient to reconstruct the object;
  determine that a second plurality of the n fragments will be stored in a second storage tier, wherein the second storage tier comprises the latent storage, wherein the second plurality of the n fragments consists of protection fragments; and
  update storage layout information to indicate location of the fragments in the first and the second storage tiers.

17. The computer-readable medium of claim 16 further comprising instructions:
  determine that available ones of the first plurality of the n fragments are not sufficient to reconstruct the object; and
  retrieve a sufficient number of the second plurality of the n fragments from the second storage tier to reconstruct the object with available ones of the first plurality of the n fragments from the first storage tier, wherein the sufficient number is according to the erasure coding.

18. The computer-readable medium of claim 16 further comprising instructions to proactively replace lost fragments of the first plurality of the n fragments using the second plurality of the n fragments although remaining ones of the first plurality of n fragments are sufficient to reconstruct the object.

19. The computer-readable medium of claim 16, wherein n is greater than several hundred and the first plurality of n fragments includes redundant fragments of the object.

* * * * *